United States Patent
Gottin et al.

(10) Patent No.: US 11,263,369 B2
(45) Date of Patent: Mar. 1, 2022

(54) WORKFLOW SIMULATION USING PROVENANCE DATA SIMILARITY AND SEQUENCE ALIGNMENT

(71) Applicant: EMC IP Holding Company LLC, Hopkinton, MA (US)

(72) Inventors: Vinícius Michel Gottin, Rio de Janeiro (BR); Daniel Sadoc Menasché, Rio de Janeiro (BR); Alex Laier Bordignon, Niterói (BR); Eduardo Vera Sousa, Niterói (BR); Manuel Ramón Vargas Avila, Rio de Janeiro (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 866 days.

(21) Appl. No.: 16/023,116

(22) Filed: Jun. 29, 2018

(65) Prior Publication Data
US 2020/0004903 A1  Jan. 2, 2020

(51) Int. Cl.
*G06F 30/20* (2020.01)
(52) U.S. Cl.
CPC .................... *G06F 30/20* (2020.01)
(58) Field of Classification Search
CPC ......... G06F 30/27; G06F 30/20; G06N 7/005; G06N 20/00; G06Q 10/0633
USPC .......................................................... 703/21
See application file for complete search history.

(56) References Cited

U.S. PATENT DOCUMENTS

| | | | | |
|---|---|---|---|---|
| 9,646,117 | B1* | 5/2017 | Kotzabasakis | G06Q 10/0633 |
| 2009/0007063 | A1* | 1/2009 | Szpak | G06F 8/34 717/105 |
| 2011/0252427 | A1* | 10/2011 | Olston | G06F 16/951 718/102 |
| 2016/0063145 | A1* | 3/2016 | Chang | G06F 30/00 703/6 |
| 2016/0224910 | A1* | 8/2016 | Deng | G06Q 30/016 |

(Continued)

OTHER PUBLICATIONS

U.S. Appl. No. 15/364,449 entitled, "Snapshots to Train Prediction Models and Improve Workflow Execution", filed Nov. 30, 2016.
(Continued)

*Primary Examiner* — Justin C Mikowski
(74) *Attorney, Agent, or Firm* — Ryan, Mason & Lewis, LLP

(57) ABSTRACT

Techniques are provided for workflow simulation using provenance data similarity and sequence alignment. An exemplary method comprises: obtaining a state of workflow executions of concurrent workflows with multiple resource allocation configurations, wherein the state comprises provenance data of the concurrent workflows; obtaining execution traces of the concurrent workflows representing different resource allocation configurations; identifying a set of states in a first execution trace and a set of states in a second execution trace as corresponding anchor states; mapping a first intermediate state to a second intermediate state between a pair of anchor states using the provenance data; generating a simulation model of the workflow executions representing the different configurations of the resource allocation; and generating new simulation traces of the workflow executions with resource allocation configurations that are not represented in the provenance data.

20 Claims, 23 Drawing Sheets

(56) References Cited

U.S. PATENT DOCUMENTS

2017/0177331 A1* 6/2017 Howard .................. G06F 16/25
2017/0269971 A1* 9/2017 Anya .................. G06Q 10/0633

OTHER PUBLICATIONS

U.S. Appl. No. 15/800,587 entitled, "Simulation-Based Online Optimization of Workflows", filed Nov. 1, 2017.
U.S. Appl. No. 15/961,033 entitled, "Deep Reinforcement Learning for Workflow Optimization", filed Apr. 24, 2018.
Carillo et al., "The Multiple Sequence Alignment Problem in Biology", SIAM Journal on Applied Mathematics, vol. 48, No. 5 pp. 1073-1082, (1988).
Moreno et al., "A Recursive Algorithm for the Forced Alignment of Very Long Audio Segments", in Fifth International Conference on Spoken Language Processing, (1998).
Prinzie et al., "Predicting Home-Appliance Acquisition Sequences: Markov/Markov for Discrimination and Survival Analysis for Modeling Sequential Information in NPTB Models", vol. 44, No. 1, pp. 28-45, (2007).
C. Fang, "From Dynamic Time Warping (DTW) to Hidden Markov Model (HMM)", University of Cincinnati, vol. 3, p. 19, (2009).
Morgenstern et al., "Multiple Sequence Alignment with User-Defined Anchor Points", Algorithms for Molecular Biology, vol. 1, No. 1, p. 6, (2006).
Ortet et al., "Where Does the Alignment Score Distribution Shape Come From", Evolutionary Bioinformatics (2010).
Huang et al., "Unsupervised Joint Alignment of Complex Images", in International Conference on Computer Vision, 2007. ICCV2007 (2007).
L. Lamport, "Time Clocks, and the Ordering of Events in a Distributed System", Communications of the ACM, (1978).

* cited by examiner

FIG. 9

$b_0$ 2 CORES: $w_1, w_2, w_3, w_4$ across $t = 0$ to $17$ $b_1$ 4 CORES: $w_1, w_2, w_3, w_4$ across $t = 0$ to $13$ $b_2$ 12 CORES: $w_1, w_2, w_3, w_4$ across $t = 0$ to $8$

FIG. 10

1. IDENTIFY CURRENT EXECUTION STATE. SUCH STATE IS PART OF MODEL STATE SPACE, AND INCLUDES SNAPSHOT PROVENANCE/TELEMETRY DATA.
2. USING A STATE MAPPING FUNCTION, ASSESS NEXT STATE (AND CORRESPONDING "COST TO GO") FOR EACH AVAILABLE CONTROL VARIABLE.
3. USING PRINCIPLED AND/OR HEURISTIC STRATEGIES, SELECT A CONTROL VARIABLE AND A CORRESPONDING NEXT STATE.
4. INCREMENT SIMULATION TIME AND RETURN TO FIRST STEP.

FIG. 14

| SIGNATURE | WORKFLOW 1 | | | | WORKFLOW 2 | | | | WORKFLOW 3 | | | | WORKFLOW 4 | | | |
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_k(1)$ | 0,8 | 0,6 | 0,0 | 1,0 | 0,9 | 1,0 | 0,6 | 0,0 | 0,7 | 0,5 | 0,8 | 0,7 | 0,8 | 0,9 | 0,5 | 0,5 |
| $s_k(2)$ | 0,8 | 0,6 | 0,0 | 1,0 | 0,9 | 1,0 | 0,6 | 0,0 | 0,7 | 0,5 | 0,8 | 0,7 | 0,8 | 0,9 | 0,5 | 0,5 |

| SIGNATURE | WORKFLOW 1 | | | | WORKFLOW 2 | | | | WORKFLOW 3 | | | | WORKFLOW 4 | | | |
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_2(1)$ | 0,0 | 0,3 | 0,7 | 0,7 | 0,6 | 0,8 | 0,2 | 0,0 | 0,5 | 0,4 | 0,4 | 0,5 | 0,7 | 0,3 | 0,0 | 0,3 |
| $s_2(2)$ | 0,0 | 0,3 | 0,7 | 0,7 | 0,6 | 0,8 | 0,2 | 0,0 | 0,5 | 0,4 | 0,4 | 0,5 | 0,7 | 0,3 | 0,0 | 0,3 |

| SIGNATURE | WORKFLOW 1 | | | | WORKFLOW 2 | | | | WORKFLOW 3 | | | | WORKFLOW 4 | | | |
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_1(1)$ | 0,5 | 0,3 | 0,0 | 0,6 | 0,2 | 0,2 | 0,0 | 0,8 | 0,4 | 0,5 | 0,7 | 0,5 | 0,8 | 0,8 | 0,0 | 0,3 |
| $s_1(2)$ | 0,5 | 0,3 | 0,0 | 0,6 | 0,2 | 0,2 | 0,0 | 0,8 | 0,4 | 0,5 | 0,7 | 0,5 | 0,8 | 0,8 | 0,0 | 0,3 |
| $s_1(3)$ | 0,5 | 0,8 | 0,5 | 0,7 | 0,6 | 0,6 | 1,0 | 1,0 | 1,0 | 0,7 | 1,0 | 0,7 | 0,9 | 0,7 | 0,5 | ... |
| ... | ... | ... | ... | ... | ... | ... | ... | ... | ... | ... | ... | ... | ... | ... | ... | ... |
| $s_1(n)$ | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 |

| SIGNATURE | WORKFLOW 1 | | | | WORKFLOW 2 | | | | WORKFLOW 3 | | | | WORKFLOW 4 | | | |
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_2(1)$ | 0,5 | 0,0 | 0,3 | 0,7 | 0,6 | 0,8 | 0,2 | 0,0 | 0,0 | 0,5 | 0,4 | 0,5 | 0,7 | 0,8 | 0,3 | 0,0 |
| $s_2(2)$ | 0,5 | 0,0 | 0,3 | 0,7 | 0,6 | 0,8 | 0,2 | 0,0 | 0,0 | 0,5 | 0,4 | 0,5 | 0,7 | 0,8 | 0,5 | 0,0 |
| $s_2(3)$ | 0,5 | 0,8 | 0,5 | 0,9 | 0,7 | 0,9 | 0,6 | 0,8 | 0,3 | 1,0 | 1,0 | 0,7 | 0,8 | 0,9 | 0,7 | 0,3 |
| ... | ... | ... | ... | ... | ... | ... | ... | ... | ... | ... | ... | ... | ... | ... | ... | ... |
| $s_2(n)$ | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 |

FIG. 16

| SIGNATURE | WORKFLOW-1 ||||  WORKFLOW-2 |||| WORKFLOW-3 |||| WORKFLOW-4 ||||
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_1(1)$ | 0,5 | 0,0 | 0,3 | 0,7 | 0,6 | 0,8 | 0,2 | 0,0 | 0,0 | 0,5 | 0,4 | 0,5 | 0,7 | 0,8 | 0,3 | 0,0 |
| $s_1(2)$ | 0,5 | 0,0 | 0,3 | 0,7 | 0,6 | 0,8 | 0,2 | 0,0 | 0,0 | 0,5 | 0,4 | 0,5 | 0,7 | 0,8 | 0,3 | 0,0 |
| $s_1(3)$ | 0,5 | 0,8 | 0,5 | 0,9 | 0,7 | 0,9 | 0,6 | 0,8 | 0,3 | 1,0 | 1,0 | 0,7 | 0,8 | 0,9 | 0,7 | 0,3 |
| $s_1(4)$ | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 |

| SIGNATURE | WORKFLOW-1 |||| WORKFLOW-2 |||| WORKFLOW-3 |||| WORKFLOW-4 ||||
|---|---|---|---|---|---|---|---|---|---|---|---|---|---|---|---|---|
| | $T_1$ | $T_2$ | $T_3$ | $T_4$ | $T_1$ | $T_2$ | $T_3$ | $T_4$ | $T_1$ | $T_2$ | $T_3$ | $T_4$ | $T_1$ | $T_2$ | $T_3$ | $T_4$ |
| $s_2(1)$ | 0,5 | 0,3 | 0,0 | 0,7 | 0,6 | 0,8 | 0,2 | 0,0 | 0,3 | 0,2 | 0,4 | 0,5 | 0,7 | 0,8 | 0,0 | 0,3 |
| $s_2(2)$ | 0,5 | 0,3 | 0,0 | 0,7 | 0,6 | 0,8 | 0,2 | 0,0 | 0,3 | 0,2 | 0,4 | 0,5 | 0,7 | 0,8 | 0,0 | 0,3 |
| $s_2(3)$ | 0,5 | 0,8 | 0,5 | 0,9 | 0,7 | 0,9 | 0,6 | 0,8 | 1,0 | 1,0 | 1,0 | 0,7 | 0,8 | 0,9 | 0,7 | 0,5 |
| $s_2(4)$ | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 | 1,0 |

| TO (TARGET)<br>FROM (SOURCE) | $s_2(1)$ | $s_2(2)$ | $s_2(3)$ | $s_2(4)$ |
|---|---|---|---|---|
| $s_1(1)$ | 0,81 | 0,81 | 3,6 | 5,82 |
| $s_1(2)$ | 0,81 | 0,81 | 3,6 | 5,82 |
| $s_1(3)$ | 1,53 | 1,53 | 0,54 | 2,76 |
| $s_1(4)$ | 2,91 | 2,91 | 1,11 | 0 |

```
MATCHING PROCESS 2100 FOR TWO SEQUENCES
1: Input two sequences of signatures:
       $s_k(i)$, for $i = 1, ..., I$ and $s_l(j)$, for $j = 1, ..., J$
2: $t_0 \leftarrow \text{argmin}_t f(s_k(i), s_l(t))$
3: $t' \leftarrow t_0$
4: while not end do
5:       $t_i \leftarrow \text{argmin}_{t:t \geq t'} f(sk(i), s_l(t))$
6:       $t' \leftarrow t_i$
7:       $i \leftarrow i + 1$
8: end while
9: Output: set of pairs $(s_k(i), s_l(t_i))$, for $i = 1, ..., I$
```

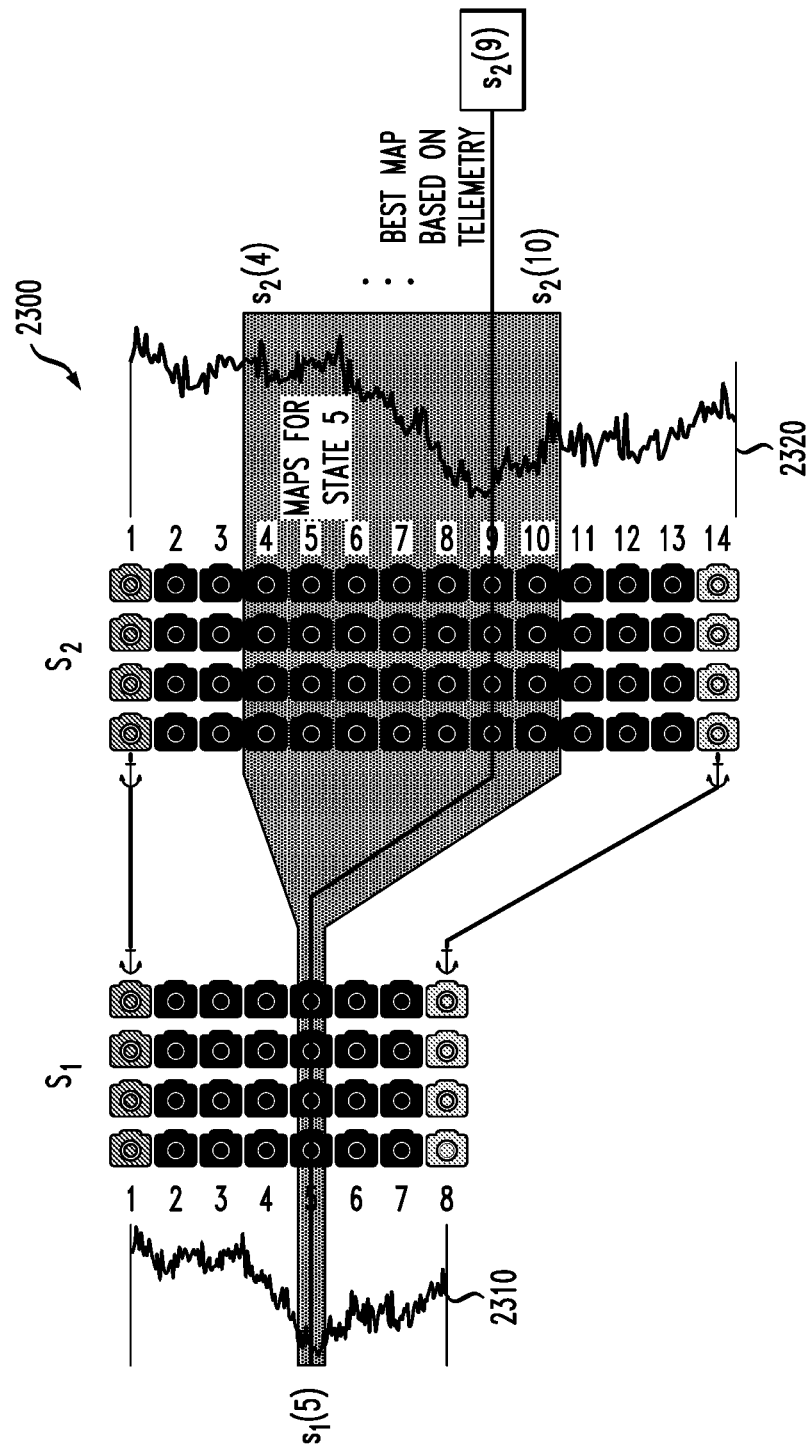

WORKFLOW SIMULATION USING PROVENANCE DATA SIMILARITY AND SEQUENCE ALIGNMENT

FIELD

The field relates generally to managing execution of a workflow in a workflow environment.

BACKGROUND

Modern industrial systems rely on automated workflows to execute tasks, such as data mining, pattern recognition and image processing. It is often challenging to allocate resources, such as the number of central processing units (CPUs) or an amount of memory, needed to execute such workflows. To cope with this challenge, one can leverage historical data about the execution of similar workflows. This historical data comprises provenance and telemetry information. In particular, the use of such data can be used for simulation-driven workflow optimization.

When allocating resources, determining an impact of different actions (e.g., resource allocation adjustments) on the next state and future dynamics of the workflow can be challenging. A mapping function determines, for one or more possible system states, a new system state after a change in the resource allocation. For example, if the number of CPUs or the amount of allocated memory is varied, the mapping function can determine the resulting system state and the forthcoming workflow dynamics.

A need exists for improved techniques for determining a new system state after changes in the resource allocation.

SUMMARY

Illustrative embodiments of the present disclosure provide techniques for workflow simulation using provenance data similarity and sequence alignment. In one embodiment, an exemplary method comprises: obtaining a state of one or more workflow executions of a plurality of concurrent workflows in a shared infrastructure environment with a plurality of different resource allocation configurations, wherein the state comprises provenance data of the concurrent workflows; obtaining a first execution trace of the concurrent workflows representing a first resource allocation configuration, and a second execution trace of the concurrent workflows representing a second resource allocation configuration; identifying a first set of first states in the first execution trace and a second set of second states in the second execution trace as corresponding anchor states; mapping a first intermediate state between a pair of the anchor states in the first execution trace to a second intermediate state between a pair of the anchor states in the second execution trace using the provenance data such that the second intermediate state is between the anchor states in the second execution trace that correspond to the pair of anchor states in the first execution trace; generating a simulation model of the one or more workflow executions representing a plurality of the different configurations of the resource allocation; and generating one or more new simulation traces of the one or more workflow executions with one or more resource allocation configurations that are not represented in the provenance data.

In some embodiments, the first intermediate state and the second intermediate state are between two anchor states that satisfy predefined task completion criteria and the mapping of the first intermediate state to the second intermediate state is based on a linear mapping between the two anchor states.

In at least one embodiment, the mapping is based on a completion of tasks, obtained from an analysis of the provenance data, of the plurality of concurrent workflows. The exemplary provenance data optionally indicates a number of substantially completed tasks of each type for each of the plurality of concurrent workflows, and the mapping can be based on a partial completion of tasks, obtained from an analysis of the provenance data, of the plurality of concurrent workflows based on a task completion cost function.

In one or more embodiments, the provenance data additionally comprises telemetry data, and the mapping is further based on a predefined similarity metric with respect to a consumption of one or more resources by the first intermediate state and the second intermediate state.

Other illustrative embodiments include, without limitation, apparatus, systems, methods and computer program products comprising processor-readable storage media.

BRIEF DESCRIPTION OF THE DRAWINGS

FIG. 9 illustrates an endogenous state space defined by sibling batches of workflows, with executions of the same workflow configurations with differing values for a number of processing cores, according to one example embodiment;

FIG. 10 illustrates exemplary pseudo code for a workflow simulation process, according to one embodiment of the disclosure;

FIG. 14 illustrates a sample of signature vectors corresponding to a set of batch executions, according to at least one embodiment;

FIG. 15 illustrates a sample of signatures corresponding to a batch of FIG. 14, in an embodiment;

FIG. 16 illustrates a sample of signatures corresponding to two batches, in some embodiments;

FIG. 21 illustrates exemplary pseudo code for a matching process, according to one embodiment of the disclosure;

FIG. 23 illustrates an example that processes telemetry data to distinguish between states with substantially equivalent signatures, according to one embodiment;

DETAILED DESCRIPTION

Figure 1:
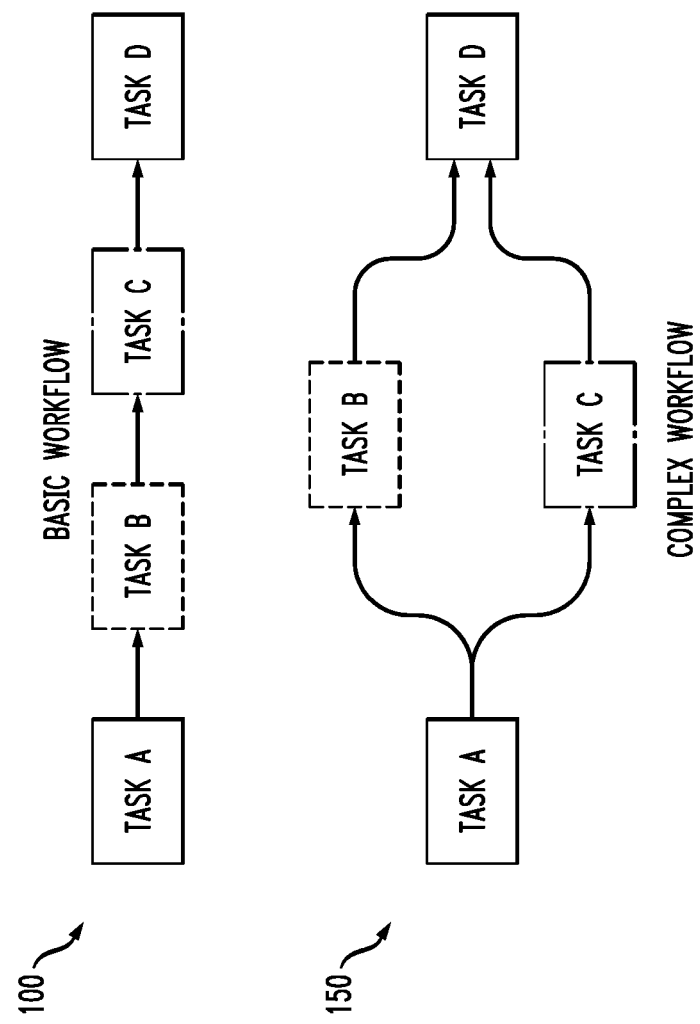
FIG. 1 illustrates an exemplary basic workflow and an exemplary complex workflow, according to some embodiments.

Illustrative embodiments of the present disclosure will be described herein with reference to exemplary communication, storage and processing devices. It is to be appreciated, however, that the disclosure is not restricted to use with the particular illustrative configurations shown. One or more embodiments of the disclosure provide methods, apparatus and computer program products for workflow simulation using provenance data similarity and sequence alignment.

In one or more embodiments, a mapping function determines, for each possible system state, a new system state after a change in the resource allocation. One state mapping function performs a linear mapping. Given two sequences of snapshots, this mapping linearly relates snapshots in the two sequences using their lengths. Details of the snapshots are not typically used, and only cardinalities are needed in some implementations. The mapping function may not take into account aspects of the workflow execution, e.g., where I/O bound operations may yield a one-to-one mapping between snapshots in two sequences which differ in the number of cores (CPUs) (or another resource) used to run the workflows. In addition, problems during the execution, e.g., pauses and high network latency that should be captured by a non-linear behavior in the mapping function, are also not taken into account by a linear mapping function.

In one or more embodiments of the present disclosure, state mapping functions are provided that deal with non-linear behavior, taking into account provenance data, telemetry data and user-defined constraints. These mapping functions automatically detect relevant states with matching characteristics, referred to as anchor states.

By characterizing the system dynamics under various resource allocation configurations, the mapping function captures features of the workflows. For example, the mapping function captures which parts of the workflow are I/O bound, and which parts are CPU bound. Such characterization can then be used, for instance, to dynamically adjust a number of cores allocated at various steps of the workflow execution.

An execution of a workflow at a given infrastructure setup produces a set of system states that characterize the evolution of workflow executions in that infrastructure. One or more embodiments of the disclosure map states under different infrastructure setups. The disclosed exemplary mapping functions in some embodiments (a) are efficient to compute, (b) have predictive power to determine the effect of changing control variables (such as CPU and memory) on the system state, and (c) account for different constraints, such as work conservation. To this aim, mapping functions are provided that incrementally account for more refined requirements, at the cost of being more expensive to compute. In at least one embodiment, the state mapping techniques described herein use features of the snapshots, such as the number of concluded tasks and features of telemetry data (e.g., CPU and memory usage).

U.S. patent application Ser. No. 15/364,449, entitled "Snapshots to Train Prediction Models and Improve Workflow Execution," (now U.S. Pat. No. 10,909,503), and U.S. patent application Ser. No. 15/800,587, entitled "Simulation-Based Online Optimization of Workflows," (now U.S. Pat. No. 11,004,025), incorporated by reference herein in their entirety, provide methodologies for future executions based on extraction of information from previous executions.

When mapping between workflow execution traces, a number of challenges are encountered.

A linear state mapping may be constructed under an assumption that there are no pauses or changes in the order of tasks within the workflow. However, to simulate complex workflow executions (with, for example, unexpected workloads or network latency), non-linear mapping functions are needed. Furthermore, in workflows with ramifications, the order of execution of tasks can change, introducing another type of non-linearity to the trace.

FIG. 1 illustrates an exemplary basic workflow 100 and an exemplary complex workflow 150. For the exemplary basic workflow 100, the execution order of Tasks A through D does not change. For the exemplary complex workflow 150, the execution order of Tasks A through D varies (e.g., either Task B or Task C can be executed first).

Figure 2:
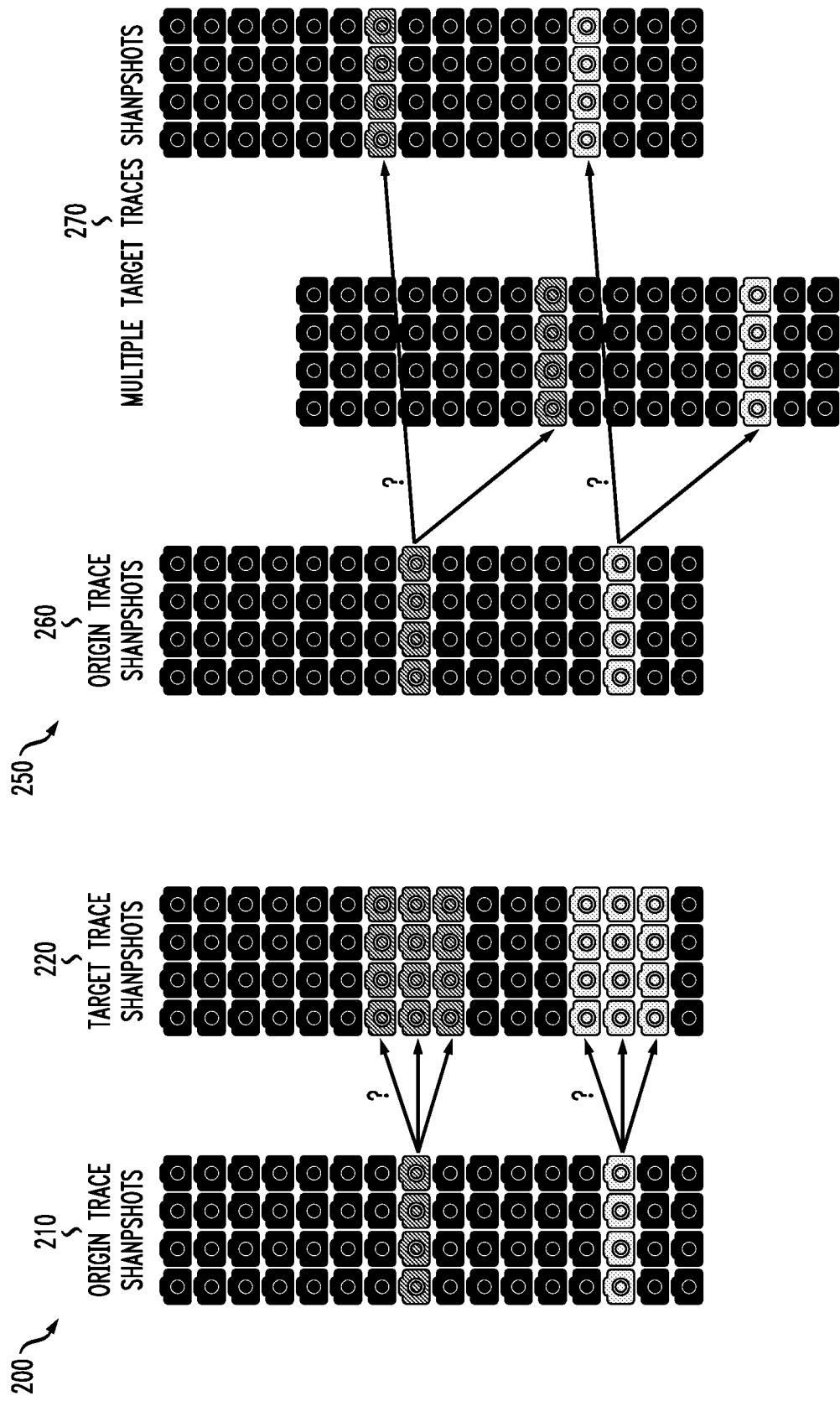
FIG. 2 illustrates a plurality of origin trace snapshots to be mapped to one or more target trace snapshots, according to an embodiment.

FIG. 2 illustrates a plurality of origin trace snapshots 210, 260 that need to be mapped to one or more target trace snapshots 220, 270, according to some embodiments. One challenge in mapping execution states of workflows is to determine a similarity metric across states to define a substantially optimal mapping. For example, a set of traces 200 comprises origin traces 210 of an execution with four processing cores that need to be mapped to one or more target traces 220 that were performed with 10 processing cores. In this case, a source state associated with an origin trace snapshot 210 can be mapped to several target states in the target trace snapshots 220 with similar features. Thus, the definition of a "best" mapping is a non-trivial task.

Another challenging problem occurs when there are multiple target traces 270. Consider, for example, a set of traces 250 having multiple target traces 270 on the right side of FIG. 2. The origin traces 260 in the set of traces 250 correspond to an execution of the workflow with four processing cores. The two sets of target traces 270 in the set of traces 250 on the right side of FIG. 2 correspond to the execution of the same workflow, both with 10 processing cores. Therefore, the two sets of target traces 270 correspond to two executions of the same workflow, under the same environment, for a given origin trace 260. The mapping function should account for such diversity.

The mapping must cope with domain-specific constraints and, in the process of defining the mapping from a source trace to a target trace, due to change of the order of execution of tasks, there is a possibility of generating inconsistent mappings. In an inconsistent mapping, the dependency relations between tasks are not respected. For example, a task not yet executed in the source trace snapshot may figure as completed in the target trace snapshot. A method for addressing mapping restrictions to avoid inconsistencies in the mappings is needed.

Figure 3:
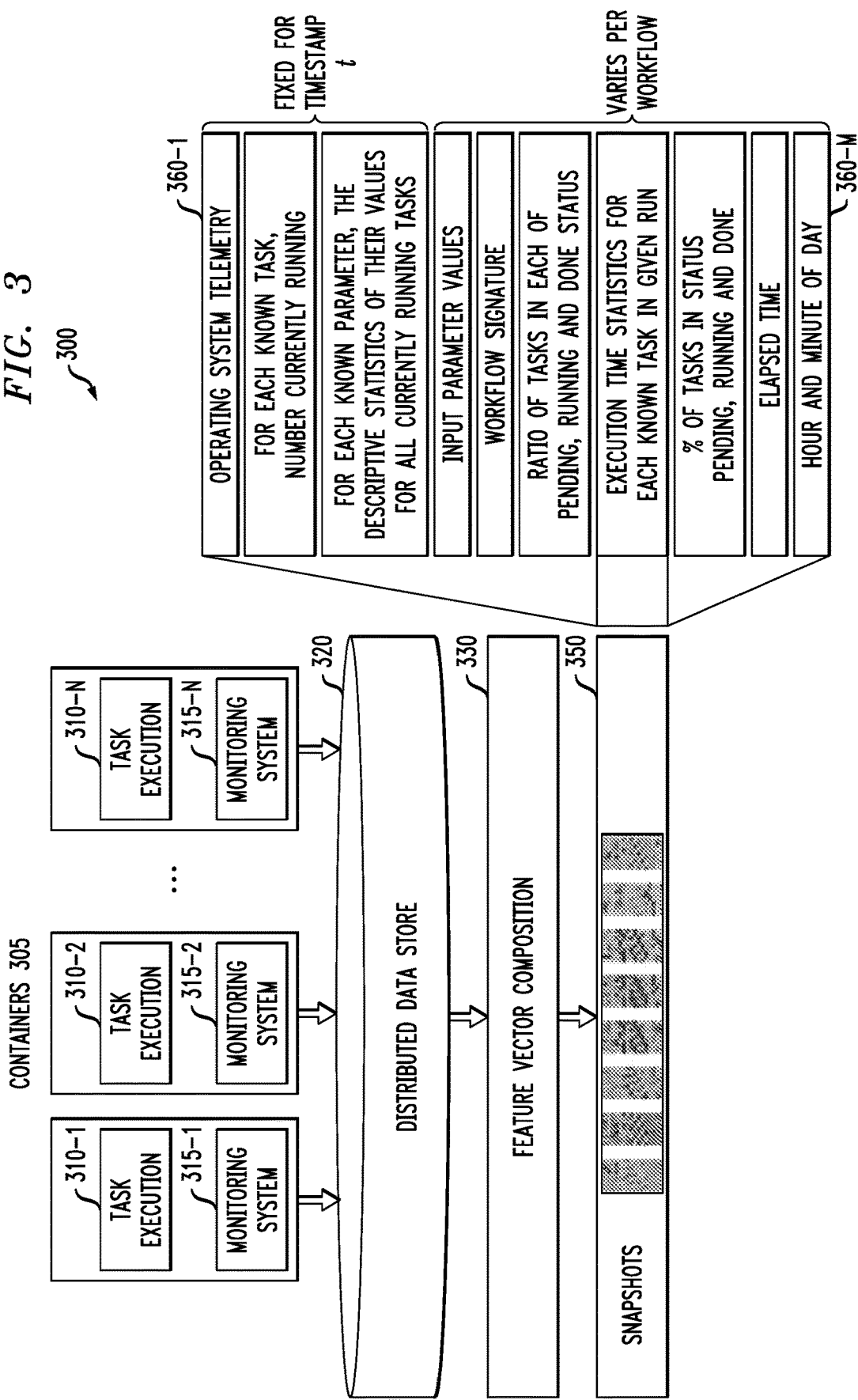
FIG. 3 illustrates an exemplary process for capturing provenance data for a plurality of tasks, and one exemplary configuration of features that comprise a snapshot, according to some embodiments.

FIG. 3 illustrates an exemplary process 300 for capturing provenance data for a plurality of tasks 310-1 through 310-N, and one exemplary configuration of features 360 that comprise a snapshot 350, according to some embodiments. As shown in FIG. 3, the plurality of tasks 310-1 through 310-N execute on one or more containers 305. The plurality of tasks 310-1 through 310-N are monitored by corresponding monitoring systems 315-1 through 315-N which capture the provenance data. The monitoring systems 315-1 through 315-N store the collected provenance data in a distributed data store 320 in the embodiment of FIG. 1.

A feature vector composition process 330 is applied to the provenance data in the distributed data store 320 to extract a plurality of the extracted features 360-1 through 360-M from the provenance data and to generate one or more snapshots 350 comprising the extracted features 360-1 through 360-M.

In the example of FIG. 3, the exemplary snapshot 350 comprises the following exemplary feature data 360-1 through 360-M commonly in the exemplary snapshot 350 extracted from workflow executions: operating system telemetry; for each known task, the number currently running; for each known parameter, the descriptive statistics of their values for all currently running tasks; input parameter values; workflow signature; ratio of tasks in pending, running and done status; execution time statistics for each known task in given run; percentage (%) of tasks with status of pending, running and done; elapsed time; and actual time (e.g., hour and minute of day).

As used herein, the provenance data optionally includes telemetry data.

An exemplary snapshot of a workflow w at instant t includes provenance data of the workflow w at that instant, as well as contextual information of all other workflows running concurrently with w. The set of workflows running concurrently is referred as a batch of workflows.

Figure 4:
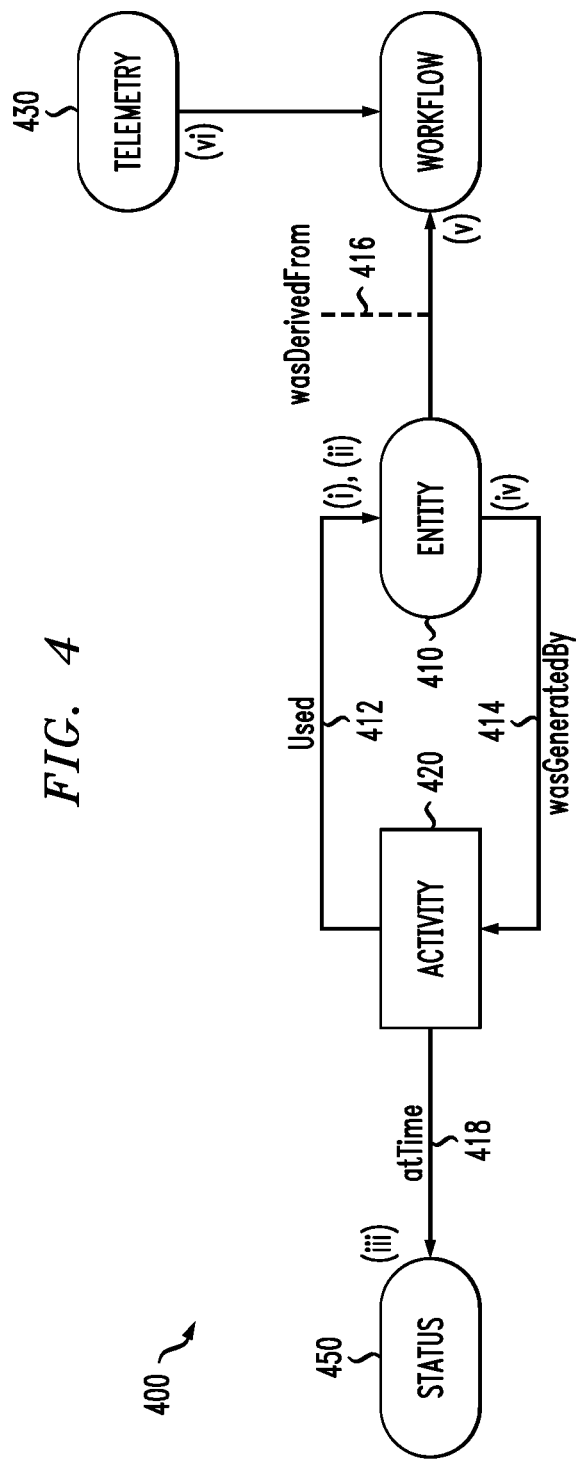
FIG. 4 illustrates the relationships between elements in a provenance graph for a workflow, according to one embodiment of the disclosure.

FIG. 4 illustrates the relationships between elements in a provenance graph 400 for a workflow, according to one embodiment of the disclosure. The vertices of the provenance graph 400 are entities 410 or activities 420. Entities are input, intermediate and output data in the workflow. Entities 410 can also be associated with abstract concepts, such as the workflow itself, telemetry registries, status of activities and computer resources, such as processors and allocated memory. Activities 420 are computer programs or human-made processes that create or transform data. Activities 420 and entities 410 are related through a consumer-producer interface. Using the PROV terminology, activities use entities (used relationship 412) and entities are generated by activities (wasGeneratedBy relationship 414). Entities 410 can be derived (wasDerivedFrom relationship 416) from other entities 410, for instance, the telemetry data 430 can be derived from a workflow execution. In one possible embodiment of the disclosure, an entity 410 is created to represent the workflow execution as a whole and a related entity 410 to represent its telemetry data 430. Besides the telemetry data 430, the entities 410 of the graph are derived from the workflow execution entity.

Activities 420 of a workflow are executed using a specific set of entities 410, which includes the input dataset and execution parameters. Besides, activities 420 get to specific statuses 450 at specific time instants (atTime relationship 418). For instance, an activity gets a 'running' status at a given timestamp to indicate that it has started its execution at that time. In one or more embodiments, the (i) input data, the (ii) parameters, the (iii) status, (iv) output data, (v) workflow execution, and (vi) telemetry data are represented as entities. However, these listed elements are stored using different semantics, as shown in FIG. 4.

Throughout the discussion, a similar definition of a snapshot is assumed as containing provenance data about the workflow execution including the description of the status of the activities (already executed, being executed or still to be executed), the assignment of resources to the activities, features of input and intermediate data sets and metrics about the execution of each activity.

Figure 5:
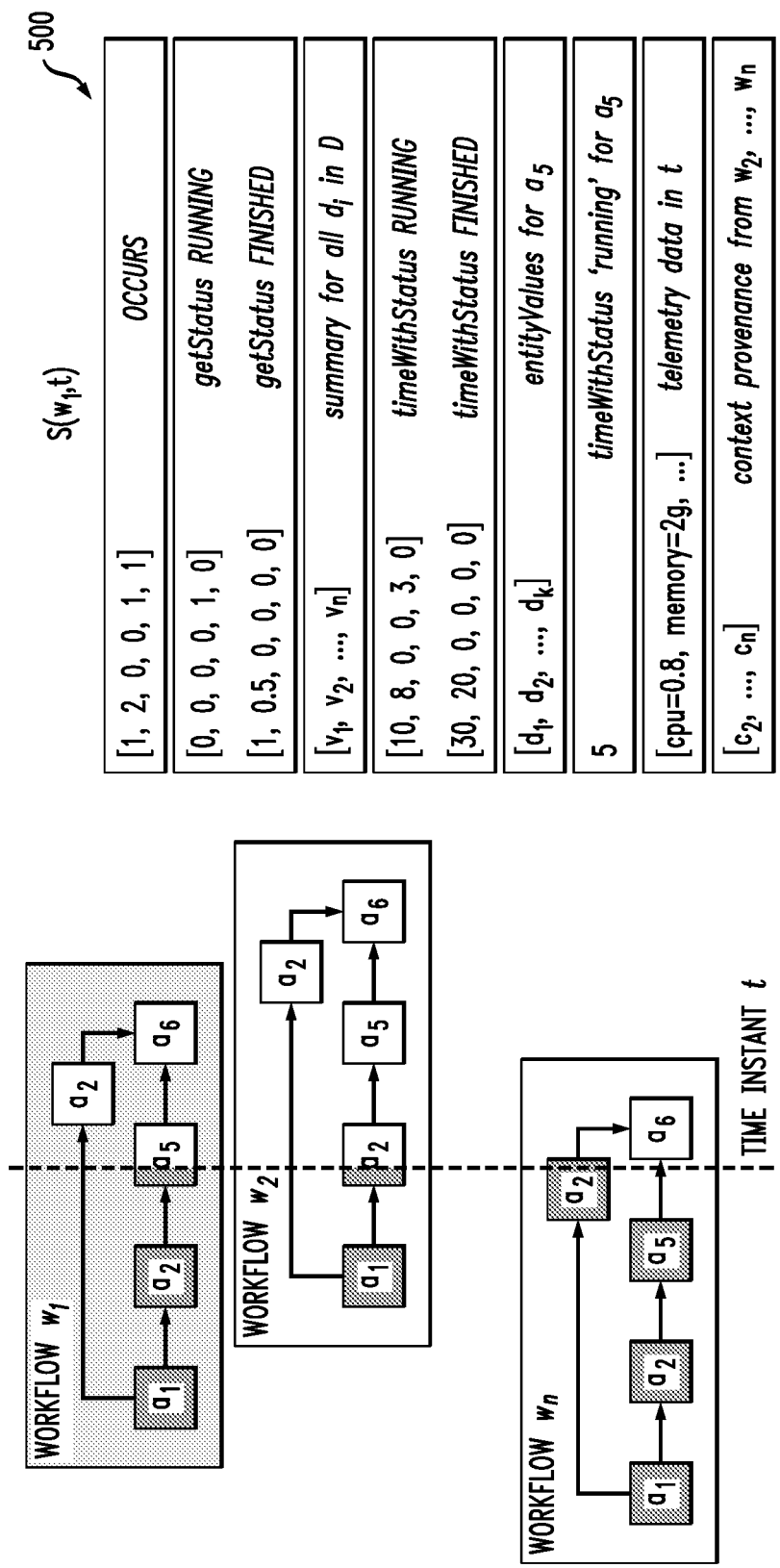
FIG. 5 shows an example of a snapshot for a workflow of a plurality of concurrent workflows, according to an embodiment of the disclosure.

FIG. 5 shows an example of a snapshot 500 for a workflow $w_1$ of a plurality of concurrent workflows $w_1$ through $w_n$, at a time instant t, according to one embodiment of the disclosure. Consider that A is the set of all known types of activities 420, D is the set of all known entities 410 and E is the set of all known status types 450 (e.g., pending, running and done). A workflow definition contains a list of activities, each of type $a_i \in A$.

Reading the snapshot 500 for workflow $w_1$, it is possible to check that activities 420 of type $a_2$ occur twice in the workflow $w_1$. It is also possible to check that an activity of type $a_5$ is running, an activity of type $a_1$ has finished and 50% of the activities of type $a_2$ in the workflow $w_1$ have finished. It is also possible to check the average execution time for every activity in the workflow. For the currently running activity of type $a_5$, it is possible to check the used values for the entities in D as well as the time spent on each state.

In addition, the snapshot 500 for workflow $w_1$ further comprises contextual provenance, $c_2, \ldots, c_n$, from the other concurrent workflows $w_2, \ldots, w_n$. For the examples discussed herein, a configuration of snapshots is assumed, similar to the one shown in FIG. 5. In this configuration, not only does snapshot S(w,t) of workflow w at instant t include telemetry data and provenance data of w at that instant, but also the contextual information of the other workflows running concurrently with w.

Notice that in the example of FIG. 5, the telemetry data captured at instant t are presented as features in each of the snapshots captured at that instant, for all workflows running concurrently. This synchronous collection of provenance data substantially guarantees that the snapshots are coherent (e.g., in a batch of workflows, a set of snapshots is said to be coherent if, during the period under consideration, one snapshot is available for each workflow at regular time intervals).

This synchronous collection of provenance data does not configure a restriction of the method, as it is possible to extrapolate the data of asynchronously captured snapshots in order to 'fill' the unrepresented time instants of a workflow that are represented in others. Additionally, even with snapshots taken at regular time intervals, a number of factors may impact snapshot coherence, including:

Startup delays: some workflows take longer to initialize than others, or may be scheduled to start when others are already running. In this case, the already running workflows would have snapshots at time instants not represented in the new one.

Pauses: the execution orchestrator may halt or pause a single workflow, generating a gap of snapshots for one or more workflows.

Asynchronous events and delays: asynchronous events and background load may cause measurement delays.

Figure 6:
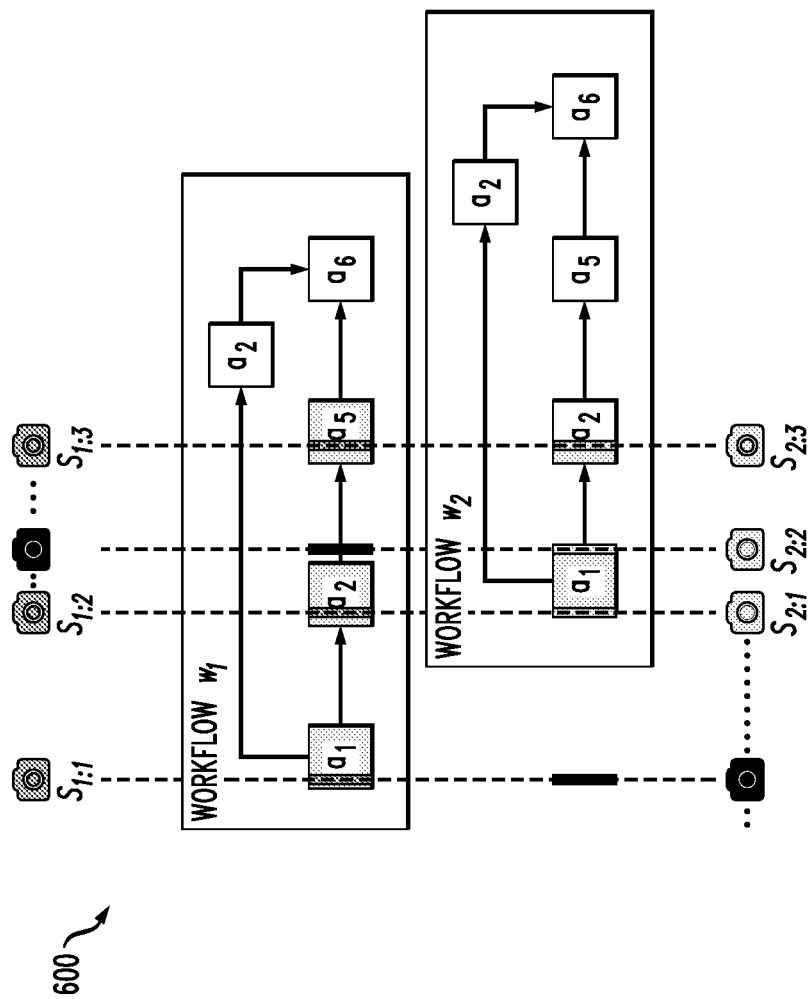
FIG. 6 illustrates a representation of exemplary snapshots, collected from an execution of two exemplary concurrent workflows, according to at least one embodiment.

FIG. 6 illustrates a representation 600 of exemplary snapshots $s_{1:1}$ through $s_{1:3}$ and $s_{2:1}$ through $s_{2:3}$, collected from the execution of two exemplary concurrent workflows $w_1$ and $w_2$, where snapshots $s_{a:z}$ are the z snapshots captured from workflow $w_a$. In FIG. 6, snapshot is taken from workflow $w_1$ before workflow $w_2$ starts, and therefore there is no concurrent snapshot from $w_2$ at that time instant. Conversely, there is no snapshot for $w_1$ taken at the same time as $s_{2:2}$ for $w_2$, exemplifying an asynchronous delay in measurement.

Many techniques are appropriate for addressing the lack of coherence in snapshots. A backward fill (e.g., assigning to a time instant the next valid snapshot for that workflow) can be applied to account for startup delays. In the example of FIG. 6, a virtual snapshot for $w_2$, which consists of a copy of $s_{2:1}$, can be created in one or more embodiments, via a backward fill to match snapshot $s_{1:1}$. A forward fill replicates the previous valid snapshot. Alternatively, an interpolation between the previous and the next available snapshots can be used as an interpolation fill, as would be apparent to a person of ordinary skill in the art. Both the forward and interpolation fill approaches may be used to generate a snapshot for $w_1$ that matches snapshot $s_{2:2}$. In the case where interpolation is used, this snapshot is generated by mixing $s_{1:2}$ and $s_{1:3}$.

Figure 7:
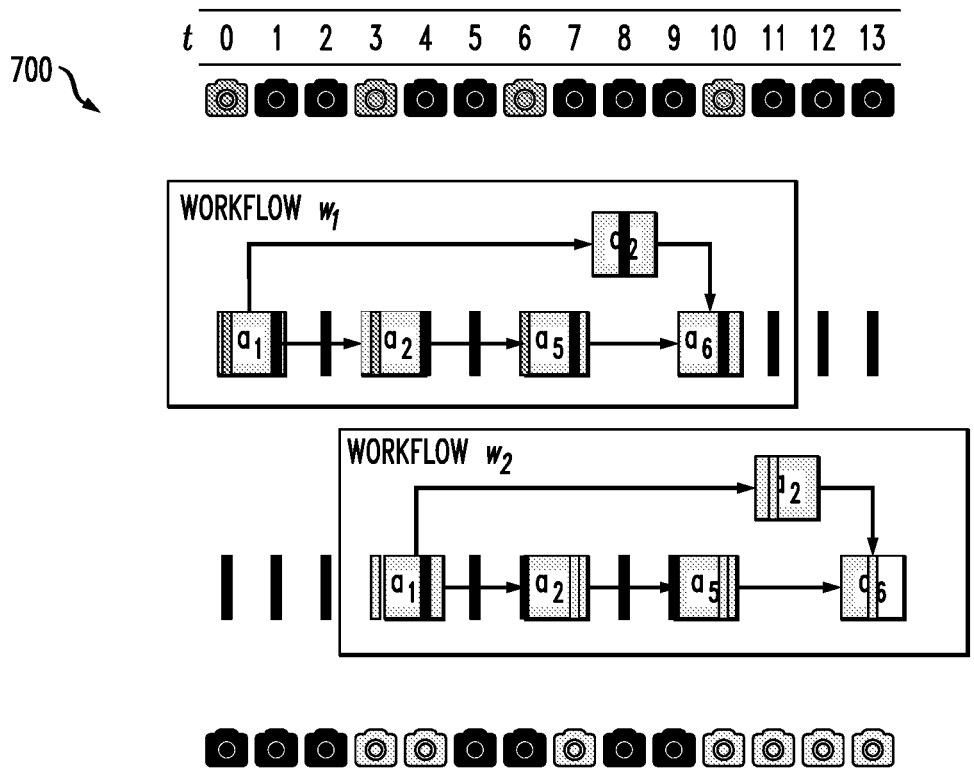
FIG. 7 illustrates a re-indexing of the snapshots of FIG. 6 for two exemplary workflows, according to an embodiment of the disclosure.

Notice that, through similar techniques as those described above for the extrapolation of the snapshots, it is also possible to increase the granularity of snapshots, if necessary. FIG. 7 illustrates a re-indexing 700 of the snapshots of FIG. 6 for the two exemplary workflows $w_1$ and $w_2$, according to an embodiment of the disclosure. It is noted that the snapshots have been re-indexed by the relative time instant t that the snapshot represents. Alternative embodiments where the absolute execution timestamps are kept are also possible, as would be apparent to a person of ordinary skill in the art. In the example of FIG. 7, coherence is substantially guaranteed by filling and interpolation, with increased granularity The substantial guarantee of coherence simplifies the simulation aspect of the present disclosure, in one or more embodiments. With one snapshot for each workflow at each instant, a state is defined as the set of snapshots taken at the same instant. The concept of state is also tied to the concept of control variables: a state is an observable configuration of the system in that it is possible to enact a change in control variables. In FIG. 7, each of the fourteen time instants 0-13 defines a state, where each state comprises two snapshots (one for each workflow).

A coherent set of snapshots naturally yields a state space with cardinality proportional to the size of the workflow batch (e.g., the workflows' duration). As described further below, the implementation of state transitions is also simplified once coherence is substantially guaranteed.

Among the features collected in each snapshot, consider a set of one or more control variables. These control variables represent features that can be controlled by the workflow execution orchestrator. Typically, in applications for decision making and optimization in Infrastructure as a Service (IaaS) environments, these variables are related to the usage and allocation of computational resources to certain tasks or workloads.

In one or more example embodiments, a single control variable is assumed (e.g., the number of allocated execution cores for the execution of a batch of four workflows hereinafter referred to as the number of cores). The disclosed techniques for simulation-based online optimization of workflows presented herein, however, apply to cases in which several control variables are defined, as would be apparent to a person of ordinary skill in the art. One generalization of the concept would be to consider these variables as a tuple whose domain is the Cartesian product of the domains of the component variables.

The control variables determine the possible 'actions' of the workflow execution orchestrator. In the running example, this corresponds to increasing or decreasing the number of cores allocated for the execution of a batch of workflows. The possible values for the control variables limit and determine the transitions in a state-space, as will be described below. In the use case described herein, the control variable is discrete, but continuous variables can be used by applying discretization techniques, such as binning of relevant ranges, as would be apparent to a person of ordinary skill in the art.

Control variables can be defined after the provenance data is collected, as long as the control variable is among the collected features.

Service Level Agreements (SLAs) in IaaS environments usually define metrics of quality of service (QoS). Examples of usual metrics include uptime of service, accuracy of results, substantially minimal resource allocation, substantially maximum execution time, and total execution cost. The optimization problem in workflow executions in IaaS environments is defined with respect to one or more QoS metrics, accounting for the control variables, as described above.

The workflow optimization problem in IaaS is defined as a substantial maximization (or minimization) of utility (negative utility) metrics over the execution of one or more workflows sharing and competing for computational resources. From the perspective of the service provider, an important aspect for optimization is to substantially minimize resource allocation while still ensuring that SLA conditions are met. In the running example, a negative utility metric of total execution cost is used, which directly relates to resource consumption (number of cores) and total execution time, and aim at substantially minimizing the total running cost for a batch of concurrent workflows.

Recall a basic description of a use case that is referred to throughout this document in order to illustrate the present disclosure. This case configures a typical embodiment of the disclosure, with many possible generalizations. Some of these generalizations are described in the related sections, above, and others are described along the text.

The running example comprises the executions of batches of four concurrent workflows each, where each workflow is an instantiation of a known workflow configuration (the set of activities and the partial order between them that constitutes the configuration of a workflow). At each time instant, one snapshot of each of these four workflows is collected. As discussed above, at time instant t, one snapshot is collected for each of the workflows $w_1, w_2, \ldots w_n$ where n=4.

Each snapshot includes the values of the arguments passed to each activity already started in the workflow, as well as the execution times for each activity. As described above, each snapshot also has features related to the aggregate context provenance of the other three workflows running concurrently to it, such as which activities are currently executing in the other workflows. Among the features collected in each snapshot for the running example is the number of cores, the value assigned to the control variable during the executions of the four workflows within the respective batch. The possible configurations for the single control variable are two cores, four cores or 12 cores.

Recall the discussion on coherence of snapshots and definition of a state, discussed above. Assume in the running example that snapshots for each workflow in a batch are collected synchronously (e.g., one snapshot for each workflow every three seconds). In the present example, a state is a set of four snapshots (the configuration of the four workflows running in a same batch) where the infrastructure orchestrator can change the number of cores allocated for the execution of that batch. In this particular case, since changes in the number of cores can be made every second, and to cope with the lack of coherence due to the issues pointed out above, the granularity of the snapshots was increased from once every three seconds to once every second.

In one or more embodiments, the total cost function that configures one exemplary utility metric function is as follows:

$$\overline{C} = \Sigma_{t=1}^{T} C(n_t) + D_t$$

where: $C(n_t)$ gives the number of cores allocated at instant t; $D_t$ is the cost of changing configuration of number of cores (0 if no change at instant t); T is the total running time; and $\overline{C}$ configures the total cost for a period of T seconds.

Snapshot Based Simulation

In this section, a state space data structure is built from coherent snapshots of workflow batch executions that can configure a simulation system capable of generating traces that were not represented in the provenance data used to build those snapshots. Furthermore, this state space allows counterfactual reasoning about what the best decisions over a control variable would be in each of the observed states, even if those decisions were not observed themselves.

Figure 8:
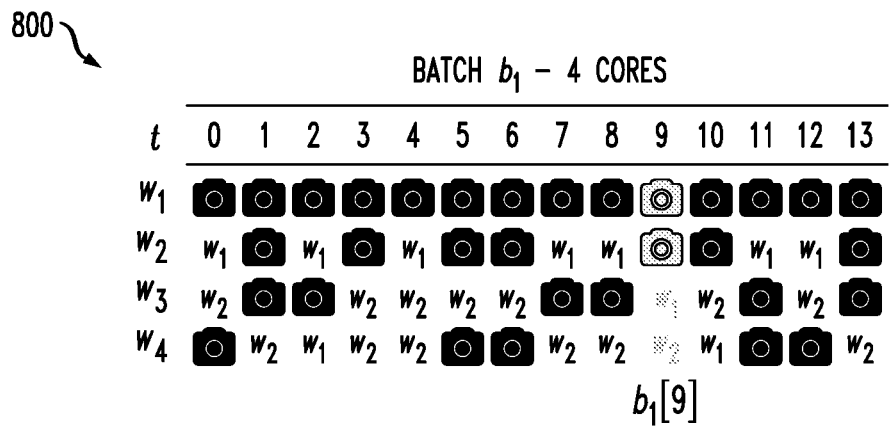
FIG. 8 illustrates a static configuration where at least one control variable is fixed, according to some embodiments.

Recall from previous definitions that a set of concurrent snapshots represents multiple workflows running in parallel. A set of workflows running together in a coordinated fashion is referred to as a batch. FIG. 8 provides a representation 800 of the timestamped snapshots of a batch $b_1$ of executions of workflows $w_1, w_2, w_3$ and $w_4$ with four processing cores, according to an embodiment of the disclosure.

FIG. 8 illustrates a static configuration (e.g., one in which the control variable(s) are kept fixed for the complete execution). Although the following examples reference batches of static configurations for ease of explanation, one or more embodiments of the disclosure also cover the cases in which configurations are dynamic (e.g., with batches in which the control variable is changed mid-execution).

It is noted that real executions of workflow batches may be very long, and that the running example shows a very small batch (executed for 13 time units—here, seconds) for ease of explanation.

In one or more embodiments, t is implemented as an array of absolute execution times for the present use case, but this is not necessary for the general method presented herein (the values of each batch's t array could be re-indexed to start at zero with no effects on the following exposition). In fact, the representation of time is only necessary for clarity of exposition—define $b_i[j]$ to be the state (e.g., the set of snapshots) given by batch $b_i$ at instant j. FIG. 8 highlights exemplary state $b_1[9]$, for example.

The present disclosure assumes a coordinated provenance collection regarding the control variable: where workflows with similar configurations have been executed with variation solely in control variables (ceteris paribus). This defines the concept of sibling batches—batches that represent the execution of the same workflows, differing only in the value of the control variable(s).

FIG. 9 illustrates an endogenous state space 900 defined by sibling batches $b_0$, $b_1$ and $b_2$ of workflows, with executions of the same workflow configurations $w_1, w_2, w_3$ and $w_4$ with differing values for the number of cores (the exemplary control variable), according to one embodiment. In the example of FIG. 9, the batches $b_0$ through $b_2$ are collected for the control variable set to 2, 4 and 12 cores, respectively.

In the example of FIG. 9, although each batch is internally coherent, batch $b_2$ is 'shorter' (e.g., composed of less snapshots) than batch $b_1$, presumably due to the execution of those workflows with 12 cores taking less time to complete than processing would take with 4 cores. These sibling batches configure the endogenous state space for that experiment.

FIG. 10 illustrates exemplary pseudo code for a workflow simulation process 1000, according to one embodiment of the disclosure. As shown in FIG. 10, the exemplary workflow simulation process 1000 comprises the following steps:
1. Identify the current execution state. Such state is part of the model state space, and includes snapshot provenance/telemetry data.
2. Using a state mapping function, assess the next state (and the corresponding "cost to go") for each of the available control variables.
3. Using principled and/or heuristic strategies, select a control variable and a corresponding next state.
4. Increment the simulation time and return to the first step.

An endogenous state mapping function, $f$ is defined as follows: $f: X \xrightarrow{a} Y$. This function relates states in the endogenous state space, mapping state X to state Y under configuration a, where the configuration corresponds to an attribution of values for the control variable(s). Thus, the endogenous state mapping establishes that in state X applying configuration a causes the system to transition from X to a state that is well approximated by state Y. State Y is the nearest neighbor of X, in the endogenous state space, under the given set of control variable(s) value(s) a.

Figure 11:
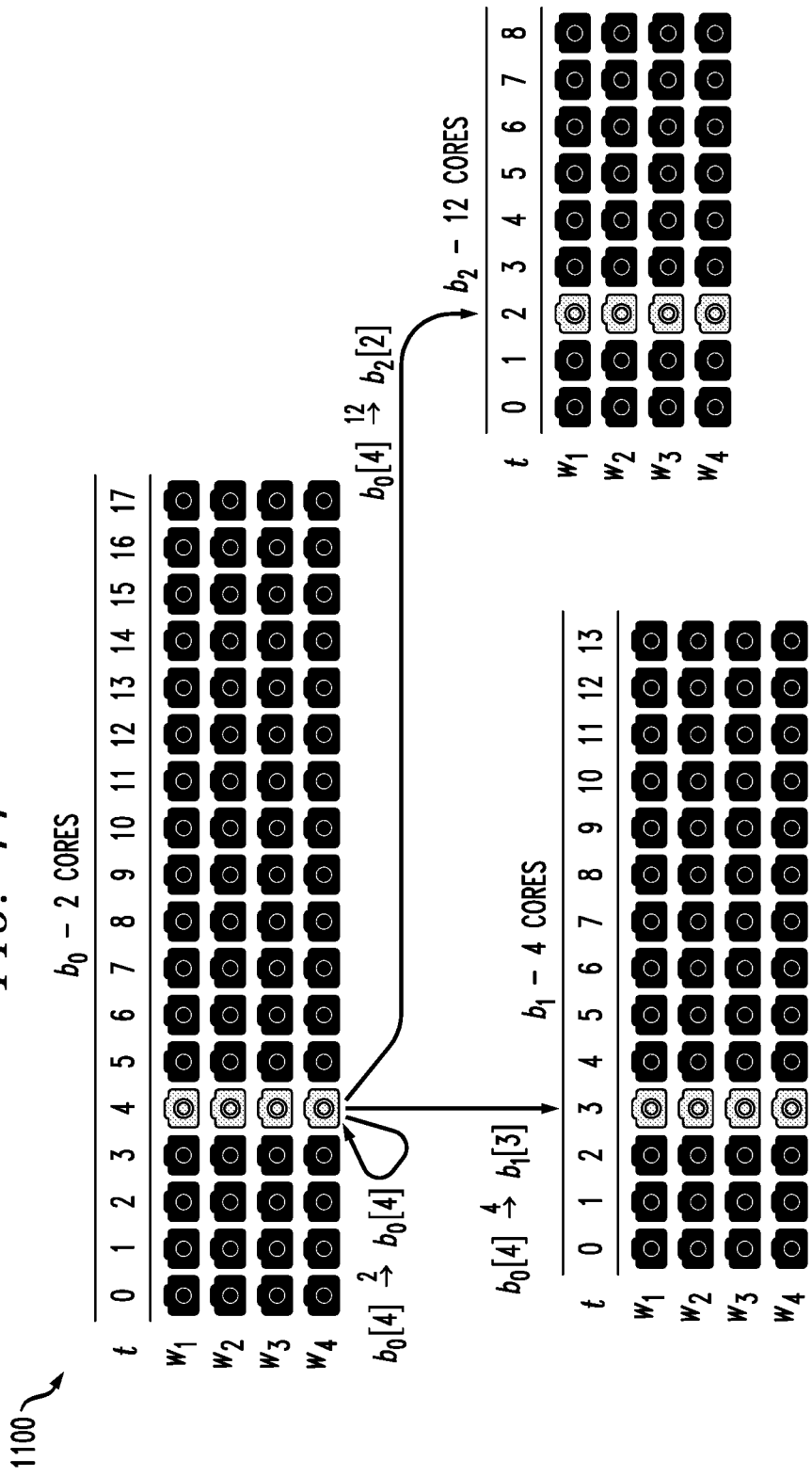
FIG. 11 illustrates an example of the endogenous state mapping function, f, for mapping of given state under exemplary changes to a number of processing cores in an endogenous state space, according to an exemplary implementation.

FIG. 11 illustrates an example of the endogenous state mapping function, $f$ for mapping 1100 of state $b_0[4]$ (e.g., snapshot 4 of state $b_0$) under actions 2, 4 and 12 (e.g., exemplary changes in number of cores, the control variable) in the endogenous state space, according to an exemplary implementation of the endogenous mapping function.

Notice that this mapping does not represent an advance in execution time—it merely 'translates' the current state to the substantially most similar one with a different value for the control variables. In the running example, state $b_0[4]$ under a configuration with 2 cores translates into $b_0[4]$ itself, while under configuration 12 cores it translates into $b_2[2]$.

Many alternative implementations of endogenous mapping functions can be defined, as would be apparent to a person of ordinary skill in the art. Consider two such possible alternate implementations in the domain of the running example:

1. Mapping Based on Batch Length: this is an example of an endogenous mapping function where no details of the snapshots composing the state are used. This function comprises mapping states by the relative time instant they represent in their respective batches. This is the mapping applied in the example of FIG. 11, where batch $b_0$ is twice the length of batch $b_2$, and therefore $b_0[4]$, being the 5$^{th}$ state in batch $b_0$, maps to the 3$^{rd}$ state of batch $b_2$. This method has the advantage of being relatively easy to compute, and may achieve reasonable results if batches do not contain pauses in workflow executions nor great variations in the order of execution of tasks within workflows (assuming preemption with continuity).

2. Mapping Based on Workflow Stages: this is an example of an endogenous mapping function where details of the snapshots composing the state are used. This relates to and is enabled by the collection of contextual provenance data in the snapshots, as discussed above. This function comprises observing, in the contextual provenance information of the snapshots composing the state, which tasks have already finished. Then, the state is mapped into the earliest state in the target batch in which the same set of tasks has already finished. This method has the advantage of more accurately representing resource consumption aspects of the tasks within workflows, especially when the profile of resource consumption varies a lot between tasks. The 'loss' of work represented by returning to the start of the running tasks in the target state can represent that changing the control variable(s) requires restarting those executions (assuming preemption with restart).

Mapping Based on Provenance Data Similarity and Sequence Alignment

One or more embodiments of the disclosure extend the application domain of the methodology described above to more complex workflows where the mapping between states does not correspond to a linear model (e.g., in execution environments where pauses and changes in an order of the tasks can occur).

To determine a substantially optimal mapping, the collected telemetry data is processed to identify a similarity between the snapshots. These new mappings are defined in the following discussion, where $s_k(i)$ is a signature vector containing the fraction of completed tasks of each type for each workflow, at the i-th snapshot of the k-th execution of a given batch of workflows; and $s_k(i,m)$ is a fraction of completed tasks of type m, at the i-th snapshot of k-th batch execution.

Anchor-Based State Mapping

An alternative to the linear state mapping scheme is to use an anchor-based scheme, where the anchors work as checkpoints for the execution trace, as shown in FIG. 10. The main challenge consists in determining which snapshots should be used as anchors. Depending on the application, we can use an interactive scheme, where the user manually sets the anchors. Alternatively, we can adopt automatic schemes, as described in the remainder of this disclosure.

Figure 12:
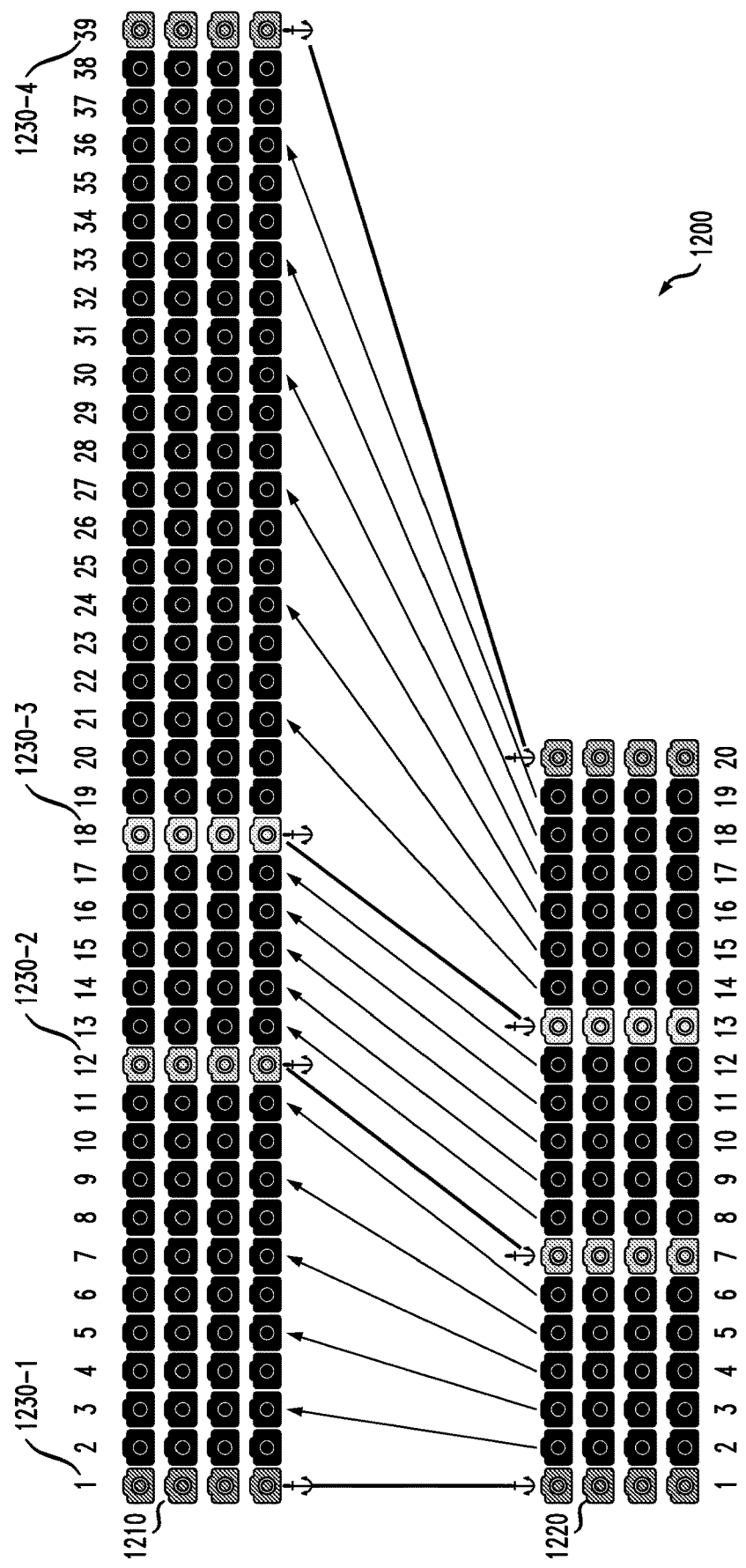
FIG. 12 illustrates an anchor-based state mapping between a batch of workflows for a first resource allocation configuration and the batch of workflows with a second resource allocation configuration, according to some embodiments.

FIG. 12 illustrates an anchor-based state mapping 1200 between a batch of workflows for a first resource allocation configuration 1210 and the batch of workflows with a second resource allocation configuration 1220, according to some embodiments. FIG. 12 illustrates anchors 1230-1 through 1230-4 for the first resource allocation configuration 1210 at times 1, 12, 18 and 39, that map to corresponding anchors for the second resource allocation configuration 1220.

Once the anchors 1230 are determined, one can map the states in-between the determined anchors 1230 linearly.

Figure 13:
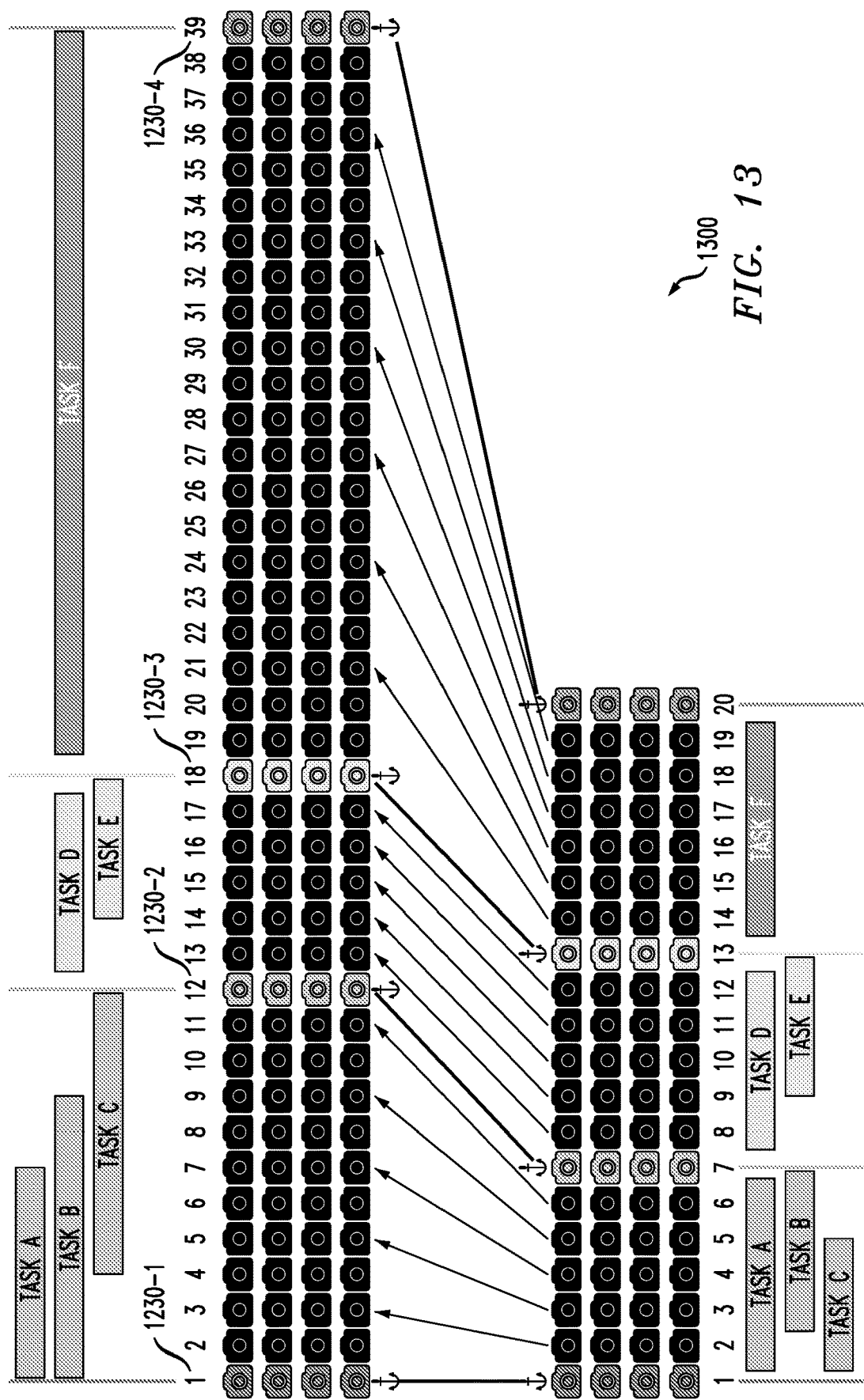
FIG. 13 illustrates an anchor-based state mapping with linear features between anchors determined for the workflow configurations shown in FIG. 12, according to at least one embodiment.

FIG. 13 illustrates an anchor-based state mapping 1300 with linear features between the anchors 1230 determined for the workflow configurations shown in FIG. 12, according to at least one embodiment. For example, if a workflow is paused during a certain interval of time, the number of snapshots in-between anchors 1230 will be the same under all considered configurations. As shown in FIG. 13, tasks A, B and C are completed between the anchors 1230-1 and 1230-2, and tasks D and E are completed between the anchors 1230-2 and 1230-3. Therefore, the piecewise-linear mapping in-between anchors 1230, during that interval, will comprise a one-to-one mapping between snapshots in different configurations.

The piecewise linear mapping in-between anchors 1230 is a first step towards improving the quality of linear state mappings. This approach, however, may produce sub-optimal mappings when there are changes in the order of execution of the workflow tasks. To address that challenge, the anchor-based scheme is combined with additional constraints on the state mappings, as further detailed in the following discussion.

Provenance-Based Anchor Mapping

One or more embodiments of the disclosure provide a non-linear method to automatically determine anchors. Recall that each workflow snapshot comprises information about the number of completed tasks of each type, for each workflow in a batch. The disclosed anchor mapping is based on a cost function that takes into consideration the amount of completed tasks per batch. Let $s_k(i)$ be a signature vector containing a fraction of completed tasks of each type, for each workflow, at the i-th snapshot of the k-th execution of a given batch of workflows. The l-th entry of $s_k(i)$ contains the fraction of completed tasks of type l, at the i-th snapshot of the considered batch execution. Let L be the total number of workflow types per batch.

FIG. 14 illustrates a sample 1400 of signature vectors $s_k(i)$ corresponding to a set of batch executions, according to at least one embodiment. Each cell in the i-th line of the k-th batch corresponds to an entry of $s_k(i)$.

FIG. 15 illustrates a sample of signatures 1500 corresponding to batch 1 of FIG. 14, in an embodiment. In FIG. 15, the cell 1510 indexed by $s_1(1,1)$, with value 0.5 indicates that fifty percent of task $T_1$ of workflow 1 were completed in the first snapshot. Likewise, the cell corresponding to element $s_1(2.11)$ has a value of (0.4) and the cell corresponding to element $s_1(2.15)$ has a value of (0.3).

It is noted that two consecutive signatures, $s_k(j)$ and $s_k(j+1)$, will coincide if no task was completed between snapshots j and j+1. When the time between snapshots is small, typically at most one task will complete at a time (e.g., there is at most one distinct entry in two consecutive snapshots). However, for more coarse-grained resolutions, there may be multiple distinct entries at consecutive snapshots.

From Cost Functions to Mappings

Next, signatures are used as ingredients of cost functions to determine state mappings. Given a source (origin) signature, one goal is to determine a target (destination) signature that best matches the source. The substantially best target, in one or more embodiments, is given by the signature that substantially minimizes the following cost function:

$$f(s_k(i), s_h(j)) = \sum_{n=1}^{N} \varphi(s_k(i,n), s_h(j,n)), \quad (1)$$

where φ(x,y) is the cost of mapping from a source state wherein a fraction x of the tasks of a given type were completed to a target where a fraction y of such tasks were completed. Given source signature $s_k(i)$, let $s_h(t^*)$ be the best target signature at batch execution h. Then, t* is given by $$t^* = \operatorname{argmin}_t f(s_k(i), s_h(t)). \quad (2)$$

For concreteness, an instance of φ(x,y) is illustrated that, in some embodiments, serves well for the intended purposes:

$$\varphi(x, y) = \begin{cases} 0.6|x - y|, & x < y \\ 0.3|x - y|, & x > y \\ 0, & x = y \end{cases} \quad (3)$$

Intuitively, the above weight function favors mappings wherein the number of completed tasks in the source and target states are similar to each other (x=y). This captures the desired aspect that work should be conserved (e.g., mappings where work is neither lost nor created should be preferred).

The weight function also relatively favors mappings where the number of completed tasks in the target state is smaller than the number of completed tasks in the source state (x>y), meaning that a loss of work is undesirable but acceptable. If the number of completed tasks is greater in the target than in the source, e.g., if x<y, then the loss function attributes a higher loss weight to the mapping. Such mapping is disfavored because tasks should not be completed without subsumed work being executed.

Consider the following example of the application of the above weight function with the described instance of φ(x,y). Assume the following signatures of batches executions $s_1$ and $s_2$, from FIGS. 14 and 15, with only four states each for simplicity.

FIG. 16 illustrates a sample of signatures 1600 corresponding to batch 1 (top) and batch 2 (bottom), in some embodiments. State $s_1(3)$ is highlighted in FIG. 16, as the source for the mapping function in the present example.

Consider as source state $s_1(3)$. According to equation (2), since there are four states in $s_2$, it is desired to find the target signature in $s_2$ that minimizes the cost function. Thus, the substantially minimum value is found among $f(s_1(3), s_2(1))$, $f(s_1(3), s_2(2))$, $f(s_1(3), s_2(3))$ and $f(s_1(3), s_2(4))$.

Figure 17:
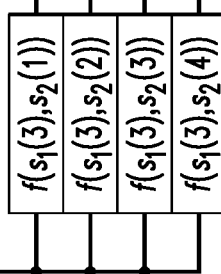
FIGS. 17 and 18 illustrate examples of the computation of the mapping between state, according to an embodiment.
Figure 18:
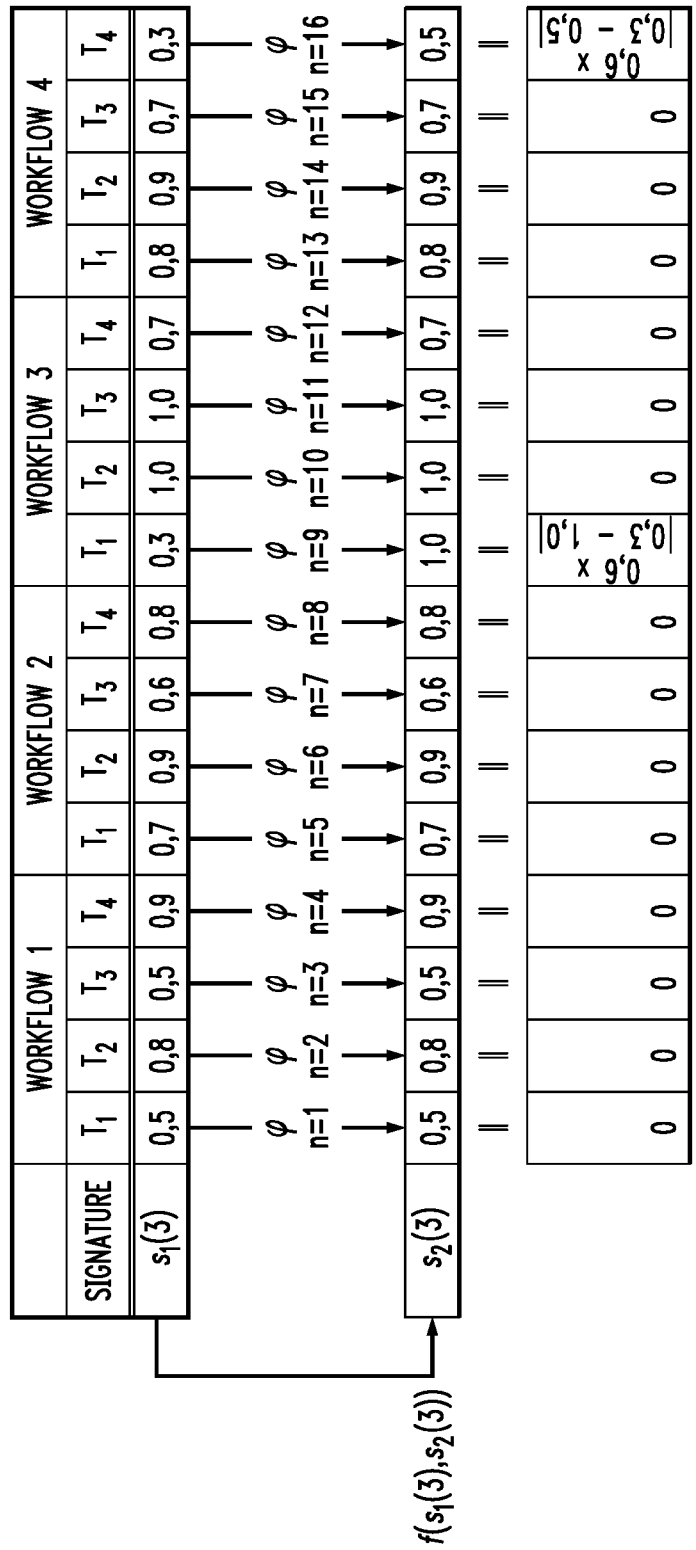

FIGS. 17 and 18 illustrate an example 1700, 1800, respectively, of the computation of the mapping from state $s_1(3)$ to a state in target batch $s_2$. This requires computing the distance from $s_1(3)$ to each signature in the target batch.

For each of the four executions (with 1≤j≤4), according to equation (1):

$$f(s_1(3), s_2(j)) = \sum_{n=1}^{N} \varphi(s_1(3,n), s_2(j,n)).$$

Since there are 16 tasks ($T_1, T_2, T_3, T_4$ for each of the four workflows 1 through 4) in each of the signatures, φ($s_1$(3, n), $s_2$(j,n)) is calculated 16 times. These calculations of φ(x,y) are represented in FIG. 18 for the distance between $s_1(3)$ and $s_2$ (3)—with j=3.

According to the exemplary definition of φp(x,y), the cost when the proportion of complete tasks are equal is zero. For the cases where n=9 and n=16, however, the source signature $s_1(3)$ has completed more work on the corresponding tasks in the target signature $s_2(3)$. Thus, the difference in that proportion is weighted by 0.6 in both cases.

The final distance $f$ ($s_1(3)$, $s_2(3)$) between $s_1(3)$ and $s_2(3)$ is the sum of all those values, as given by equation (1). Thus, the final value for $f$ ($s_1(3)$, $s_2$ (3)) is 0,54.

Figures 19, 20:
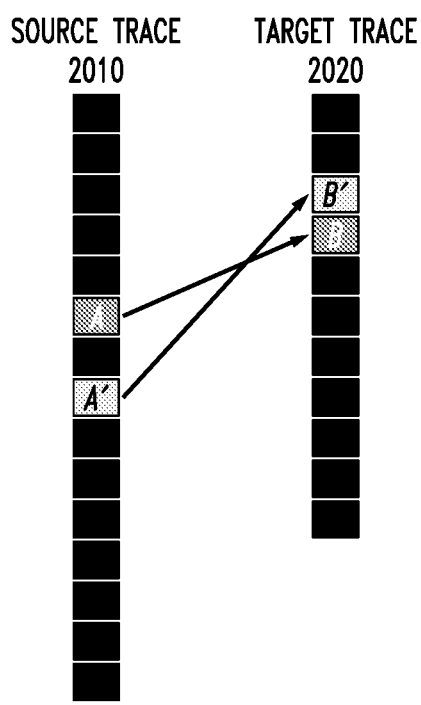
FIG. 19 illustrates a cost matrix for exemplary state mappings with the costs for each mapping in the example, according to one or more embodiments.
FIG. 20 illustrates states in a source trace and target trace of a workflow execution, according to an embodiment.

FIG. 19 illustrates a complete cost matrix 1900 for the mapping from $s_1$ to $s_2$ with the costs for each mapping in the example, according to one or more embodiments. The substantially optimal mappings (with substantially minimum costs) are highlighted.

The cost matrix 1900 evidences the substantially optimal mappings. In the running example, state $s_1(1)$ maps to either state $s_2$ (1) or $s_2$ (2), with the same cost. A telemetry-based strategy is described below for disambiguation when the cost function yields substantially the same value for multiple target states. State $s_1(3)$ maps to state $s_2$ (3), as that is the minimum cost for that source state. State $s_1(4)$ maps to state $s_2$ (4) perfectly, with a cost of zero. This is usually the case for anchor states, as they are known to have the same proportion of finished tasks.

Work Conservation: Hard Versus Soft Constraints

The above definition of the cost function accounts for soft constraints with respect to work conservation. In particular, the penalty for concluding tasks without executing the corresponding work is captured through the cost weight 0.6. Note that if the weight 0.6 is replaced by ∞ in the definition of function φ, the soft constraint on work conservation becomes a hard constraint. Depending on the number of available snapshots, such a stringent constraint may degenerate the problem. For example, depending on the order at which tasks are executed, there may be no mapping compatible with the hard constraint other than mapping every source state to the initial state of the target trace.

Incremental Construction of Mapping

Next, an incremental approach is presented to build a mapping function. The main idea consists of applying equation (2) to match states, while substantially guaranteeing that additional constraints are satisfied. In particular, a simple constraint is employed that determines that if a state A occurs before state A' at a given execution, its target B should occur before state B' at the target execution. Such constraint establishes a rule that is similar in spirit to those rules used to obtain pictures from a distributed system consistent with partial orderings.

FIG. 20 illustrates states A and A' in a source trace 2010 and states B and B' in a target trace 2020 of a workflow execution, according to an embodiment. As shown in FIG. 20, there is a cross mapping 2000 between states A' and B' and states A and B. In particular, state A (resp., B) occurs before state A' (resp., B') in a workflow execution. One or more embodiments optionally guarantee that for any state A', the state B' to which A' maps to does not occur before B, which is the target of A.

Formally, let relationship R capture a set of existing state mappings. Then, $(s_k(i), s_l(j)) \in R$ denotes the fact that $s_l(j)$ is the match (target) of $s_k(i)$ (source) under R. Relationship R is augmented incrementally, using equation (2). While doing so, the following additional constraint concerning the absence of crossing is enforced. Given a relationship R, the following must hold, $$(s_k(i), s_l(j)) \in R \Rightarrow (s_k(i+x), s_l(j-y)) \notin R, x \geq 0, y \geq 0.$$

Given a relationship R, and a pair $(s_k(i), s_l(j)) \in R$, let t' be the minimum value such that $(s_k(i+1), s_l(t'))$ does not violate the restriction above. Then, t* is chosen, as follows, $$t^* = \operatorname{argmin}_t f(s_k(i+1), s_l(t))$$

$$s.t.\ t \geq t'.$$

After finding such value of t*, $(s_k(i+1), s_l(r))$ is added to relationship R and the next match is found, until all source signatures are matched to a given target.

FIG. 21 illustrates exemplary pseudo code for a matching process 2100, according to one embodiment of the disclosure. As shown in FIG. 21, the exemplary matching process 2100 comprises the following steps:

```
1:    Input two sequences of signatures:
      s_k(i), for i = 1, ..., I and s_l(j), for j = 1, ..., J
2:    t_0 ← argmin_t f(s_k(i), s_l(t))
3:    t' ← t_0
4:    while not end do
5:        t_i ← argmin_{t:t≥t'} f(s_k(i), s_l(t))
6:        t' ← t_i
7:        i ← i + 1
8:    end while
9:    Output: set of pairs (s_k(i), s_l(t_i)), for i = 1, ..., I
```

The exemplary matching process 2100 is used to map all states from the source sequence of signatures to the target sequence. To match multiple target sequences, their pairings are considered two by two.

Telemetry-Based Refinement of Anchor Mapping

One should notice that the minimization of function $f$ may lead to multiple potential mappings due to ties from a given source signature. Given that consecutive snapshots usually have similar signatures (a discussed above), such ties may occur. Thus, each set of snapshots is potentially associated with a range of sets of snapshots in the target batch.

Figure 22:
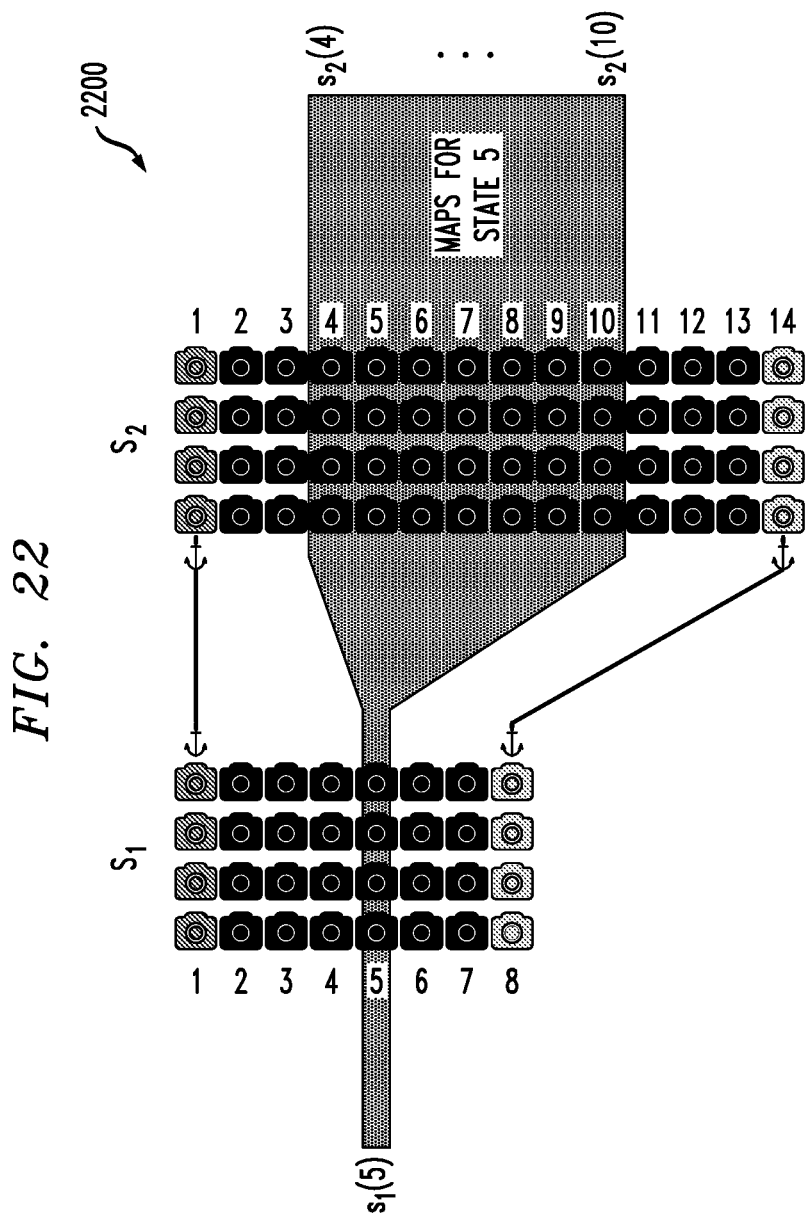
FIG. 22 illustrates a set of snapshots associated with a range of sets of snapshots via the cost function described herein, according to at least one embodiment of the disclosure.

FIG. 22 illustrates a set of snapshots 2200 associated with a range of sets of snapshots via the cost function described herein, according to at least one embodiment of the disclosure. In the example of FIG. 22, all the consecutive highlighted states $s_2(4)$, $s_2(5)$, $s_2(10)$ in the target batch 52 (right side of FIG. 22) have similar signatures, yielding substantially the same cost for state $s_1(5)$ from the origin batch $s_1$ (left side of FIG. 22). Considering the provenance database techniques described above, the mappings are all equally likely.

One possible strategy to break such ties is to map each snapshot to the first snapshot within the set of signatures that minimizes the cost function. In FIG. 22, this would mean arbitrarily assigning the mapping from $s_1(5)$ to $s_2(4)$. In some experiments, although this strategy provides reasonable results, it has been found to lead to more frequent re-working of workflow tasks.

In one or more embodiments, the mappings between states (sets of snapshots) with substantially equivalent signature vectors are refined, effectively solving the problem of distinguishing between equivalent mappings, while avoiding most of the re-workings of the naïve approach. The target state is selected with the substantially closest progress level compared to the source snapshot $s_1$, as measured using telemetry data within the provenance data.

Generally, the behavior of telemetry data is expected to be similar when two different traces execute the same tasks, which yields a notion of progress. Leveraging this idea, a mapping can be determined between snapshots with substantially the same signature vector that substantially maximizes the overlap in terms of the amount of work executed per task. Typically, telemetry values are measurements related to the consumption and availability of computational resources and operating systems, such as CPU, Memory and IO.

FIG. 23 illustrates an example 2300 that processes telemetry data to distinguish between states with substantially equivalent signatures, according to one embodiment. In the example of FIG. 23, the exemplary telemetry data series 2310, 2320 represents a memory consumption over time.

As shown in FIG. 23, state $s_1(5)$ is ultimately mapped to $s_2(9)$, which represents not only an appropriate state of the execution (e.g., the signature that substantially minimizes the cost function) but also the most similar consumption of computational resources (which correlates, for example, with the type of work being executed), as given by the telemetry data. In the example, state $s_2(9)$ is chosen as it represents a similar 'low' in the consumption of memory to the one in state $s_1(5)$.

In the examples of FIGS. 22 and 23, the states with substantially similar signatures are all from the same batch execution. The technique for disambiguation based on telemetry data described herein could also be used to differentiate between states from different batches. This could be useful, for example, when multiple batches with each configuration are available for the mapping function.

One challenge concerning similarity analysis based on telemetry data is based on the fact that workflows executed in different environments have different execution times. Therefore, it may be necessary to align the telemetry data series to produce the telemetry footprint of each trace. There are several algorithms to perform alignment between time series with different lengths, such as Dynamic Time Warping (DTW) (see, e.g., C. Fang, "From Dynamic Time Warping (DTW) to Hidden Markov Model (HMM)," University of Cincinnati, Vol. 3, page 19 (2009)). DTW is adopted in one or more embodiments as the reference algorithm for telemetry alignment.

Figure 24A:
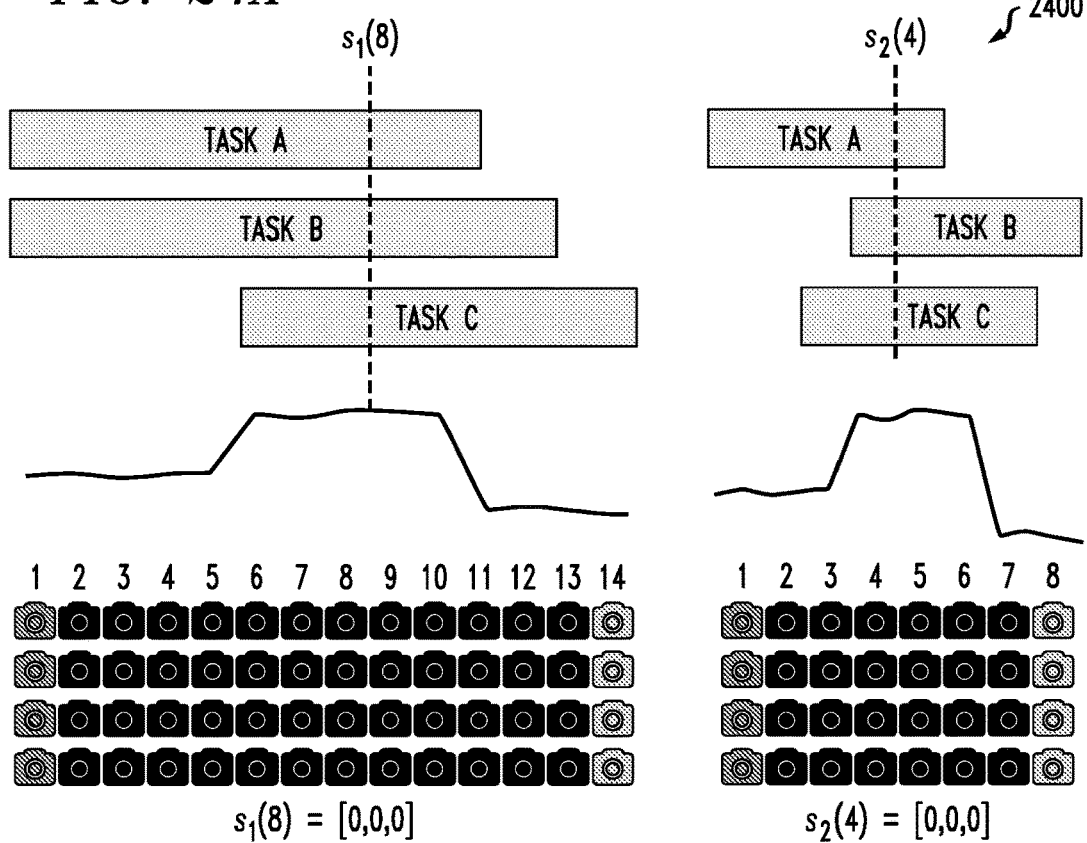
FIGS. 24A, 24B, 25A and 25B illustrate refinements of mappings between a snapshot in a source trace into a snapshot in a target trace with substantially the same signature vector using telemetry data and an alignment between time series with different lengths, according to one example.
Figure 24B:
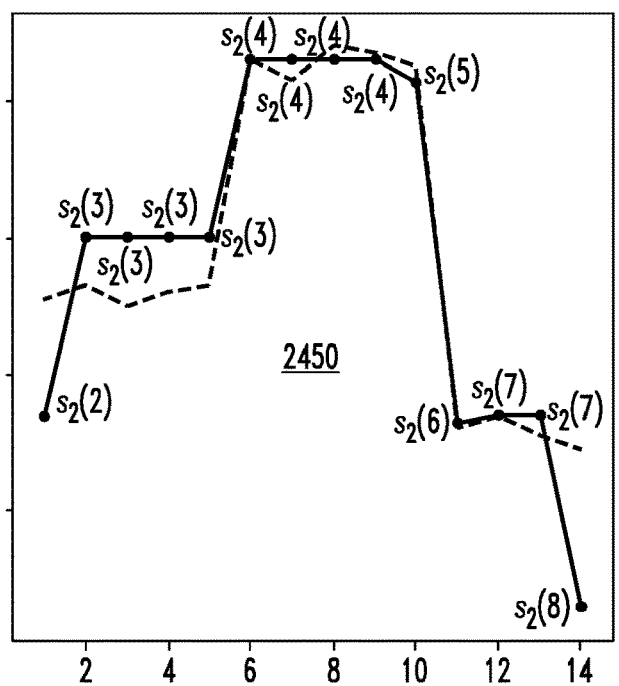

FIGS. 24A and 24B illustrate a refinement of mappings between a snapshot in a source trace $s_1(8)$ into a snapshot in a target trace $s_2(4)$ with substantially the same signature vector using telemetry data and a DTW-based alignment between time series with different lengths, according to one example. FIG. 24A illustrates snapshots 2400 of two different traces $s_1(8)$ and $s_2(4)$ with telemetry data and signature vectors. FIG. 24B illustrates the telemetry data alignment 2450 between the source trace and the target trace using DTW.

In particular, consider the mapping from source trace $s_1(8)$ into one of the signatures $s_2(i)$, for i=1, . . . , 8. Given the provenance data (vectors of task completions), one cannot distinguish between a number of potential target states, as their signature vectors are substantially the same.

Nonetheless, analyzing the telemetry data with the DTW algorithm, for example, it is possible to infer that a good choice for the mapping is into snapshot $s_2(4)$, as shown in FIG. 24A. Under such mapping, part of tasks A, B, and C still needs to be redone.

Notice that the method is not guaranteed in some embodiments to solve ambiguities when the telemetry data cannot be substantially matched to a single most-similar state. Nonetheless, the mapping is able to refine a broad set of options given by the pure provenance-based strategy.

Figure 25A:
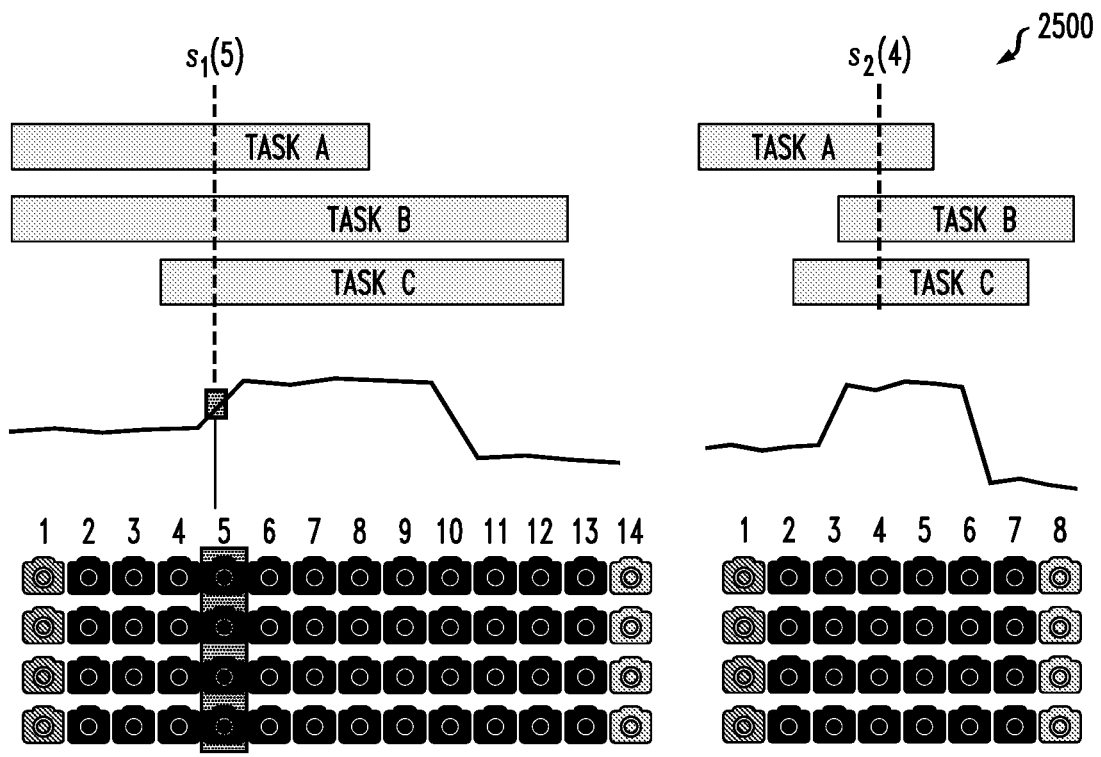
Figure 25B:
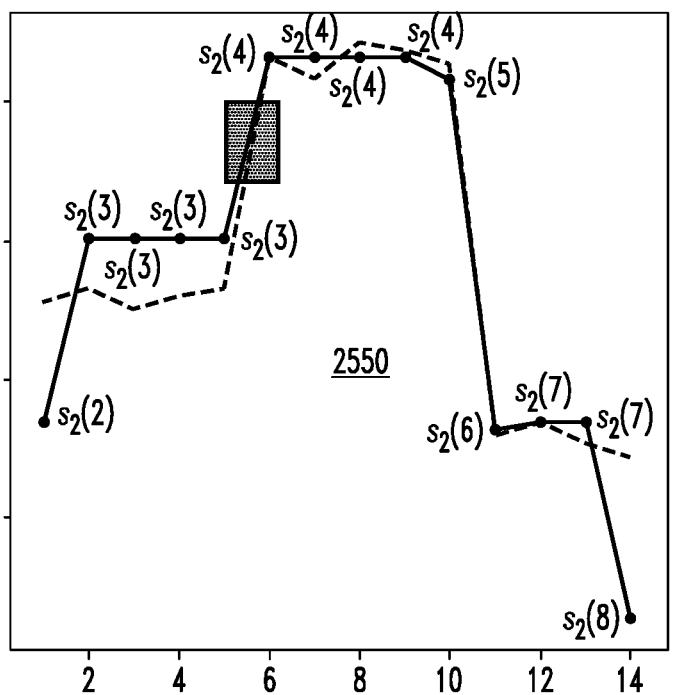

FIGS. 25A and 25B illustrate a refinement of the mappings 2500 between a snapshot in a source trace $s_1(5)$ into a snapshot in a target trace $s_2(4)$ with substantially the same signature vector using telemetry data and a DTW-based alignment 2550 between time series with different lengths, according to another example.

In FIG. 25A, state $s_1(5)$ cannot be disambiguated uniquely, as the telemetry signature corresponding to that state (falls in-between states $s_2(3)$ and $s_2(4)$ when the series are aligned 2550 in FIG. 25B (shaded in blue in (b)).

Notice that in the examples of FIGS. 24 and 25 only a single telemetry value is considered, for simplicity. In practice, however, multiple telemetry data streams could be used to make that decision, either alone or in combination, as would be apparent to a person of ordinary skill in the art. For a more detailed discussion of the multi-dimensional case of the DTW algorithm for both cases, see, for example, M. Shokoohi-Yekta et al., "On the Non-Trivial Generalization of Dynamic Time Warping to the Multi-Dimensional Case," in SDM 2015.

In one or more embodiments, discussed further below, the bindings between the states in source and target execution traces are manually defined using disclosed anchor definitions. Such anchors are optionally defined in an interactive mode, which grants to the user more control over the flow of execution.

In some embodiments, state mapping techniques are provided, using anchors and provenance data, that generate non-linear mappings between execution traces. With this mapping, an execution can be simulated, and the control variables of the environment can be determined in order to substantially minimize a cost function in a new execution.

In a provenance-based mapping, each source state is typically associated with multiple potential target states (e.g., because there are typically multiple states with the same signature). The number of completed tasks of each type in each of those states is often the same, possibly leading to ambiguous state characterizations. A substantially most similar state is determined in some embodiments based on a telemetry-based modeling.

One or more embodiments of the disclosure provide methods and apparatus for simulation-based optimization of workflows using provenance data similarity and sequence alignment. The foregoing applications and associated embodiments should be considered as illustrative only, and numerous other embodiments can be configured using the techniques disclosed herein, in a wide variety of different applications.

Workflows are important building blocks of modern industrial systems. In one or more embodiments, a new methodology is provided to substantially optimize the infrastructure (e.g., computation power, memory and storage) used to execute workflows, appropriate for Infrastructure as a Service environments. One or more embodiments leverage workflow snapshots into an online optimization approach based on simulation and state-similarity functions. Generally, the resource allocation is substantially optimized for a new execution of concurrent workflows.

It should also be understood that the disclosed workflow simulation techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed workflow simulation techniques may be implemented using one or more processing platforms. One or more of the processing modules or other components may therefore each run on a computer, storage device or other processing platform element. A given such element may be viewed as an example of what is more generally referred to herein as a "processing device."

As noted above, illustrative embodiments disclosed herein can provide a number of significant advantages relative to conventional arrangements. It is to be appreciated that the particular advantages described above and elsewhere herein are associated with particular illustrative embodiments and need not be present in other embodiments. Also, the particular types of information processing system features and functionality as illustrated and described herein are exemplary only, and numerous other arrangements may be used in other embodiments.

In these and other embodiments, compute services can be offered to cloud infrastructure tenants or other system users as a Platform as a Service (PaaS) offering, although numerous alternative arrangements are possible.

Some illustrative embodiments of a processing platform that may be used to implement at least a portion of an information processing system comprise cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components such as a workflow simulation engine, or portions thereof, are illustratively implemented for use by tenants of such a multi-tenant environment.

Cloud infrastructure as disclosed herein can include cloud-based systems such as Amazon Web Services (AWS), Google Cloud Platform (GCP) and Microsoft Azure. Virtual machines provided in such systems can be used to implement at least portions of a cloud-based workflow simulation platform in illustrative embodiments. The cloud-based systems can include object stores such as Amazon S3, GCP Cloud Storage, and Microsoft Azure Blob Storage.

In some embodiments, the cloud infrastructure additionally or alternatively comprises a plurality of containers implemented using container host devices. For example, a given container of cloud infrastructure illustratively comprises a Docker container or other type of Linux Container (LXC). The containers may run on virtual machines in a multi-tenant environment, although other arrangements are possible. The containers may be utilized to implement a variety of different types of functionality within the storage devices. For example, containers can be used to implement respective processing devices providing compute services of a cloud-based system. Again, containers may be used in combination with other virtualization infrastructure such as virtual machines implemented using a hypervisor.

Illustrative embodiments of processing platforms will now be described in greater detail with reference to FIGS. 26 and 27. These platforms may also be used to implement at least portions of other information processing systems in other embodiments.

Figure 26:
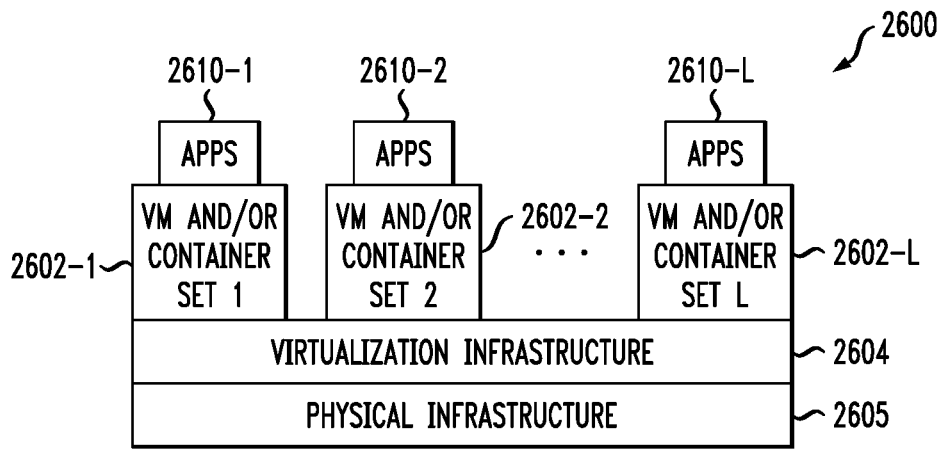
FIG. 26 illustrates an exemplary processing platform that may be used to implement at least a portion of one or more embodiments of the disclosure comprising a cloud infrastructure.

FIG. 26 shows an example processing platform comprising cloud infrastructure 2600. The cloud infrastructure 2600 comprises a combination of physical and virtual processing resources that may be utilized to implement at least a portion of a workflow simulation system. The cloud infrastructure 2600 comprises multiple virtual machines (VMs) and/or container sets 2602-1, 2602-2, . . . 2602-L implemented using virtualization infrastructure 2604. The virtualization infrastructure 2604 runs on physical infrastructure 2605, and illustratively comprises one or more hypervisors and/or operating system level virtualization infrastructure. The operating system level virtualization infrastructure illustratively comprises kernel control groups of a Linux operating system or other type of operating system.

The cloud infrastructure 2600 further comprises sets of applications 2610-1, 2610-2, . . . 2610-L running on respective ones of the VMs/container sets 2602-1, 2602-2, . . . 2602-L under the control of the virtualization infrastructure 2604. The VMs/container sets 2602 may comprise respective VMs, respective sets of one or more containers, or respective sets of one or more containers running in VMs.

In some implementations of the FIG. 26 embodiment, the VMs/container sets 2602 comprise respective VMs implemented using virtualization infrastructure 2604 that comprises at least one hypervisor. Such implementations can provide workflow simulation functionality of the type described above for one or more processes running on a given one of the VMs. For example, each of the VMs can implement workflow simulation logic for providing workflow simulation functionality for one or more processes running on that particular VM.

An example of a hypervisor platform that may be used to implement a hypervisor within the virtualization infrastructure 2604 is the VMware® vSphere® which may have an associated virtual infrastructure management system such as the VMware® vCenter™. The underlying physical machines may comprise one or more distributed processing platforms that include one or more storage systems.

In other implementations of the FIG. 26 embodiment, the VMs/container sets 2602 comprise respective containers implemented using virtualization infrastructure 2604 that provides operating system level virtualization functionality, such as support for Docker containers running on bare metal hosts, or Docker containers running on VMs. The containers are illustratively implemented using respective kernel control groups of the operating system. Such implementations can provide workflow simulation functionality of the type described above for one or more processes running on different ones of the containers. For example, a container host device supporting multiple containers of one or more container sets can implement one or more instances of workflow simulation control logic.

As is apparent from the above, one or more of the processing modules or other components of a workflow simulation system may each run on a computer, server, storage device or other processing platform element. A given such element may be viewed as an example of what is more generally referred to herein as a "processing device." The cloud infrastructure 2600 shown in FIG. 26 may represent at least a portion of one processing platform. Another example of such a processing platform is processing platform 2700 shown in FIG. 27.

The processing platform 2700 in this embodiment comprises at least a portion of the given system and includes a plurality of processing devices, denoted 2702-1, 2702-2, 2702-3, . . . 2702-K, which communicate with one another over a network 2704. The network 2704 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 2702-1 in the processing platform 2700 comprises a processor 2710 coupled to a memory 2712. The processor 2710 may comprise a microprocessor, a microcontroller, an application specific integrated circuit (ASIC), a field programmable gate array (FPGA) or other type of processing circuitry, as well as portions or combinations of such circuitry elements, and the memory 2712, which may be viewed as an example of a "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 2702-1 is network interface circuitry 2714, which is used to interface the processing device with the network 2704 and other system components, and may comprise conventional transceivers.

The other processing devices 2702 of the processing platform 2700 are assumed to be configured in a manner similar to that shown for processing device 2702-1 in the figure.

Again, the particular processing platform 2700 shown in the figure is presented by way of example only, and the given system may include additional or alternative processing platforms, as well as numerous distinct processing platforms in any combination, with each such platform comprising one or more computers, storage devices or other processing devices.

Figure 27:
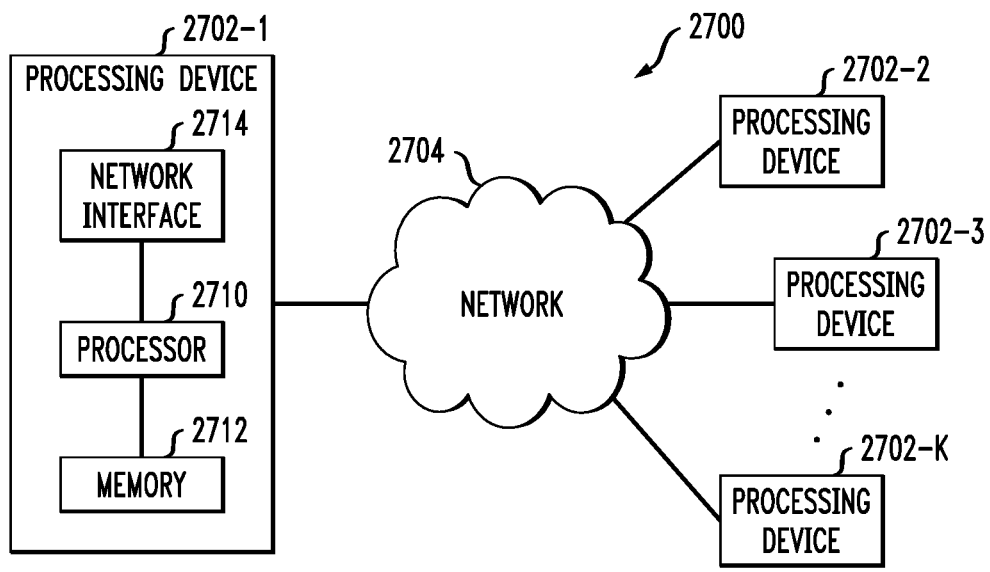
FIG. 27 illustrates another exemplary processing platform that may be used to implement at least a portion of one or more embodiments of the disclosure.

Multiple elements of system may be collectively implemented on a common processing platform of the type shown in FIG. 26 or 27, or each such element may be implemented on a separate processing platform.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure such as VxRail™, VxRack™, VxBlock™, or Vblock® converged infrastructure commercially available from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the information processing system. Such components can communicate with other elements of the information processing system over any type of network or other communication media.

As indicated previously, components of an information processing system as disclosed herein can be implemented at least in part in the form of one or more software programs stored in memory and executed by a processor of a processing device. For example, at least portions of the functionality shown in one or more of the figures are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method, comprising:
    obtaining a state of one or more workflow executions of a plurality of concurrent workflows in a shared infrastructure environment with a plurality of different resource allocation configurations, wherein said state comprises provenance data of said concurrent workflows;
    obtaining a first execution trace of the concurrent workflows representing a first resource allocation configuration, and a second execution trace of the concurrent workflows representing a second resource allocation configuration;
    identifying a first set of first states in said first execution trace and a second set of second states in said second execution trace as corresponding anchor states;
    mapping, using at least one processing device, a first intermediate state between a pair of said anchor states in said first execution trace to a second intermediate state between a pair of said anchor states in said second execution trace using the provenance data such that said second intermediate state is between the anchor states in said second execution trace that correspond to said pair of anchor states in the first execution trace, wherein the provenance data additionally comprises telemetry data, and wherein the mapping is further based on a predefined similarity metric with respect to a consumption of one or more resources by the first intermediate state and the second intermediate state;
    generating a simulation model of said one or more workflow executions representing a plurality of the different configurations of the resource allocation; and
    generating, using the at least one processing device, one or more new simulation traces of said one or more workflow executions with one or more resource allocation configurations that are not represented in the provenance data.

2. The method of claim 1, wherein the first intermediate state and the second intermediate state are between two anchor states that satisfy predefined task completion criteria and the mapping of the first intermediate state to the second intermediate state is based on a linear mapping between the two anchor states.

3. The method of claim 1, wherein the mapping is based on a completion of tasks, obtained from an analysis of the provenance data, of the plurality of concurrent workflows.

4. The method of claim 1, wherein the provenance data indicates a number of substantially completed tasks of each type for each of the plurality of concurrent workflows, and wherein the mapping is based on a partial completion of tasks, obtained from an analysis of the provenance data, of the plurality of concurrent workflows based on a task completion cost function.

5. The method of claim 1, wherein the consumption of resources by the first intermediate state and the second intermediate state correlate with a type of work being executed for the first state and the second state, and wherein the mapping further comprises the step of aligning the telemetry data for two different workflow executions.

6. The method of claim 1, wherein said mapping is performed for a first plurality of said intermediate states in said first execution trace to a second plurality of said intermediate states in said second execution trace such that ordering relations between states in said first plurality of intermediate states is preserved in said second plurality of intermediate states.

7. The method of claim 1, further comprising adjusting an allocation of at least one resource for an execution of said plurality of concurrent workflows based on said mapping.

8. A system, comprising:
    a memory; and
    at least one processing device, coupled to the memory, operative to implement the following steps:
    obtaining a state of one or more workflow executions of a plurality of concurrent workflows in a shared infrastructure environment with a plurality of different resource allocation configurations, wherein said state comprises provenance data of said concurrent workflows;
    obtaining a first execution trace of the concurrent workflows representing a first resource allocation configuration, and a second execution trace of the concurrent workflows representing a second resource allocation configuration;
    identifying a first set of first states in said first execution trace and a second set of second states in said second execution trace as corresponding anchor states;
    mapping, using the at least one processing device, a first intermediate state between a pair of said anchor states in said first execution trace to a second intermediate state between a pair of said anchor states in said second execution trace using the provenance data such that said second intermediate state is between the anchor states in said second execution trace that correspond to said pair of anchor states in the first execution trace, wherein the provenance data additionally comprises telemetry data, and wherein the mapping is further based on a predefined similarity metric with respect to a consumption of one or more resources by the first intermediate state and the second intermediate state;
    generating a simulation model of said one or more workflow executions representing a plurality of the different configurations of the resource allocation; and
    generating, using the at least one processing device, one or more new simulation traces of said one or more workflow executions with one or more resource allocation configurations that are not represented in the provenance data.

9. The system of claim 8, wherein the first intermediate state and the second intermediate state are between two anchor states that satisfy predefined task completion criteria and the mapping of the first intermediate state to the second intermediate state is based on a linear mapping between the two anchor states.

10. The system of claim 8, wherein the mapping is based on a completion of tasks, obtained from an analysis of the provenance data, of the plurality of concurrent workflows.

11. The system of claim 8, wherein the provenance data indicates a number of substantially completed tasks of each type for each of the plurality of concurrent workflows, and wherein the mapping is based on a partial completion of tasks, obtained from an analysis of the provenance data, of the plurality of concurrent workflows based on a task completion cost function.

12. The system of claim 8, wherein the consumption of resources by the first intermediate state and the second intermediate state correlate with a type of work being executed for the first state and the second state, and wherein the mapping further comprises the step of aligning the telemetry data for two different workflow executions.

13. The system of claim 8, wherein said mapping is performed for a first plurality of said intermediate states in said first execution trace to a second plurality of said intermediate states in said second execution trace such that ordering relations between states in said first plurality of intermediate states is preserved in said second plurality of intermediate states.

14. The system of claim 8, further comprising adjusting an allocation of at least one resource for an execution of said plurality of concurrent workflows based on said mapping.

15. A computer program product, comprising a non-transitory machine-readable storage medium having encoded therein executable code of one or more software programs, wherein the one or more software programs when executed by at least one processing device perform the following steps:
   obtaining a state of one or more workflow executions of a plurality of concurrent workflows in a shared infrastructure environment with a plurality of different resource allocation configurations, wherein said state comprises provenance data of said concurrent workflows;
   obtaining a first execution trace of the concurrent workflows representing a first resource allocation configuration, and a second execution trace of the concurrent workflows representing a second resource allocation configuration;
   identifying a first set of first states in said first execution trace and a second set of second states in said second execution trace as corresponding anchor states;
   mapping, using the at least one processing device, a first intermediate state between a pair of said anchor states in said first execution trace to a second intermediate state between a pair of said anchor states in said second execution trace using the provenance data such that said second intermediate state is between the anchor states in said second execution trace that correspond to said pair of anchor states in the first execution trace, wherein the provenance data additionally comprises telemetry data, and wherein the mapping is further based on a predefined similarity metric with respect to a consumption of one or more resources by the first intermediate state and the second intermediate state;
   generating a simulation model of said one or more workflow executions representing a plurality of the different configurations of the resource allocation; and
   generating, using the at least one processing device, one or more new simulation traces of said one or more workflow executions with one or more resource allocation configurations that are not represented in the provenance data.

16. The computer program product of claim 15, wherein the first intermediate state and the second intermediate state are between two anchor states that satisfy predefined task completion criteria and the mapping of the first intermediate state to the second intermediate state is based on a linear mapping between the two anchor states.

17. The computer program product of claim 15, wherein the mapping is based on a completion of tasks, obtained from an analysis of the provenance data, of the plurality of concurrent workflows.

18. The computer program product of claim 15, wherein the provenance data indicates a number of substantially completed tasks of each type for each of the plurality of concurrent workflows, and wherein the mapping is based on a partial completion of tasks, obtained from an analysis of the provenance data, of the plurality of concurrent workflows based on a task completion cost function.

19. The computer program product of claim 15, wherein said mapping is performed for a first plurality of said intermediate states in said first execution trace to a second plurality of said intermediate states in said second execution trace such that ordering relations between states in said first plurality of intermediate states is preserved in said second plurality of intermediate states.

20. The computer program product of claim 15, further comprising adjusting an allocation of at least one resource for an execution of said plurality of concurrent workflows based on said mapping.

\* \* \* \* \*